(12) United States Patent
Wang et al.

(10) Patent No.: US 11,362,677 B2
(45) Date of Patent: Jun. 14, 2022

(54) CHANNEL ENCODING METHOD AND ENCODING APPARATUS

(71) Applicant: HUAWEI TECHNOLOGIES CO., LTD., Guangdong (CN)

(72) Inventors: Xianbin Wang, Hangzhou (CN); Huazi Zhang, Hangzhou (CN); Rong Li, Hangzhou (CN); Jun Wang, Hangzhou (CN); Yinggang Du, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 6 days.

(21) Appl. No.: 16/926,211

(22) Filed: Jul. 10, 2020

(65) Prior Publication Data
US 2020/0343913 A1 Oct. 29, 2020

Related U.S. Application Data

(63) Continuation of application No. PCT/CN2019/071662, filed on Jan. 14, 2019.

(30) Foreign Application Priority Data

Jan. 12, 2018 (CN) .......................... 201810031522.6

(51) Int. Cl.
*H03M 13/13* (2006.01)
*H04L 1/00* (2006.01)
(Continued)

(52) U.S. Cl.
CPC .......... *H03M 13/13* (2013.01); *H04L 1/0057* (2013.01); *H03M 13/00* (2013.01); *H03M 13/09* (2013.01);
(Continued)

(58) Field of Classification Search
CPC ............ H04L 1/0057; H03M 13/1148; H03M 13/616; H03M 13/13; H03M 13/09; H03M 13/00
See application file for complete search history.

(56) References Cited

U.S. PATENT DOCUMENTS

2015/0349922 A1 12/2015 Arikan
2016/0013887 A1 1/2016 Shen et al.
(Continued)

FOREIGN PATENT DOCUMENTS

CN 102800243 A 11/2012
CN 105811998 A 7/2016
(Continued)

OTHER PUBLICATIONS

Kai Niu et al., "Polar Codes: Primary Concepts and Practical Decoding Algorithms", IEEE Comllunications Magazine Jul. 2014, Total 12 Pages.

*Primary Examiner* — April Y Blair
*Assistant Examiner* — Sazzad Hossain
(74) *Attorney, Agent, or Firm* — Womble Bond Dickinson (US) LLP

(57) ABSTRACT

The application provides a channel encoding method, an encoding apparatus, and a system. A bit sequence $X_1^N$ is output by using $X_1^N = D_1^N F_N$, where $D_1^N$ is a bit sequence obtained after an input bit sequence $u_1^N$ is encoded based on locations of K to-be-encoded information bits in an encoding diagram that has a mother code length of N, $u_1^N$ is a bit sequence obtained based on the K to-be-encoded information bits, and $F_N$ is a Kronecker product of $\log_2 N$ matrices $F_2$. A design considers that the locations of the K to-be-encoded information bits in the encoding diagram that has a mother code length of N include a row location index set H of the information bits in the encoding diagram and a layer
(Continued)

location index set M of the information bits in the encoding diagram, where $0 \leq H \leq N$, and $0 < M \leq \log_m N-1$.

20 Claims, 14 Drawing Sheets

(51) Int. Cl.
  *H03M 13/09* (2006.01)
  *H03M 13/11* (2006.01)
  *H03M 13/00* (2006.01)
(52) U.S. Cl.
  CPC ...... *H03M 13/1148* (2013.01); *H03M 13/616* (2013.01)

(56) References Cited

U.S. PATENT DOCUMENTS

| | | | |
|---|---|---|---|
| 2016/0182187 A1* | 6/2016 | Kim | H03M 13/353 |
| | | | 714/807 |
| 2017/0013525 A1* | 1/2017 | Zee | H04W 36/14 |
| 2017/0244429 A1 | 8/2017 | Hof et al. | |

FOREIGN PATENT DOCUMENTS

| | | | |
|---|---|---|---|
| CN | 106230553 | A | 12/2016 |
| CN | 106982172 | A | 7/2017 |
| CN | 107113009 | A | 8/2017 |
| CN | 107204779 | A | 9/2017 |
| CN | 107342842 | A | 11/2017 |
| CN | 107342846 | A | 11/2017 |
| EP | 1727307 | B1 | 5/2011 |

* cited by examiner

CHANNEL ENCODING METHOD AND ENCODING APPARATUS

CROSS-REFERENCE TO RELATED APPLICATIONS

This application is a continuation of International Application No. PCT/CN2019/071662, filed on Jan. 14, 2019, which claims priority to Chinese Patent Application No. 201810031522.6, filed on Jan. 12, 2018. The disclosures of the aforementioned applications are hereby incorporated by reference in their entireties.

TECHNICAL FIELD

Embodiments of the present disclosure relate to the field of encoding and decoding, and more specifically, to a channel encoding method and an encoding apparatus.

BACKGROUND

A communications system usually uses channel encoding to improve data transmission reliability and ensure communication quality. A polar code polar code is an encoding scheme that can achieve a Shannon capacity and that has low encoding and decoding complexity. The polar code is a linear block code, and includes an information bit and a frozen bit. Currently, a generator matrix of the polar code is $F_N$, and a polar encoding process is $X_1^N = u_1^N F_N$, where $u_1^N = (u_1, u_2, \ldots, u_N)$ is a binary row vector, and has a length of N. $F_N$ is an N×N matrix, $F_N = F_2^{\otimes(\log_2(N))}$, and $F_N$ is defined as a Kronecker product of $\log_2 N$ matrices $F_2$, where $$F = \begin{bmatrix} 1 & 0 \\ 1 & 1 \end{bmatrix}.$$

After a transmit end encodes an information bit by using the polar code, a receive end usually performs decoding by using successive cancellation (SC) decoding or a successive cancellation list (SCL) decoding algorithm. However, an existing polar code has a relatively high false alarm rate (FAR) in a decoding process.

SUMMARY

The application provides a channel encoding method and an encoding apparatus to improve error correction performance of a polar code in higher-order modulation.

In at least one embodiment, a design solution of the application provides a channel encoding method, including:

First, a transmit end obtains a bit sequence $X_1^N$, where $X_1^N = u_1^N G'_N$, $u_1^N$ is a bit sequence obtained based on K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$, and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, 0≤H≤N, and 0<M≤$\log_m$, N−1.

Then, the transmit end sends the bit sequence $X_1^N$.

According to the channel encoding method provided in the foregoing embodiment, the bit sequence $X_1^N$ is obtained and output by using $X_1^N = u_1^N G'_N$. Compared with an existing polar code encoding system, the output bit sequence $X_1^N$ is a bit sequence obtained by encoding $u_1^N$ by using the new matrix $G'_N$, and the new matrix $G'_N$ is a matrix generated based on the encoding generator matrix of the polar code and the locations of the K to-be-encoded information bits in the encoding diagram that has a mother code length of N. For the locations of the K to-be-encoded information bits in the encoding diagram that has a mother code length of N, not only row locations of the information bits in the encoding diagram are considered, but also layer locations of the information bits in the encoding diagram need to be considered. Particularly, a distribution design of the layer index set is considered. When the foregoing design solution is applied to an encoding process, a large quantity of simulation results prove that performance of an encoding side of the system is improved by reducing a bit error rate of the encoding system. Further, in a decoding process of the encoding method, whether a decoding algorithm is stopped in advance is determined based on cyclic redundancy check (CRC), so that decoding performance is improved, and a FAR on a decoding side is greatly reduced.

In the foregoing possible channel encoding design, the new matrix $G'_N = BC + BC_{\bar{H}}$, where $$B = F_2^{\otimes M} \otimes \text{diag}\left(\text{ones}\left(\frac{N}{2^M}, 1\right)\right),$$

$C = F_2^{\otimes n}$, and $n = \log_2 N$.

Further, in the foregoing possible channel encoding design, the bit sequence $u_1^N$ obtained by the transmit end includes the K to-be-encoded information bits and N–K fixed bits, and the K to-be-encoded information bits are placed at locations, in the zeroth layer in the encoding diagram, corresponding to the row location index set H.

Further, in the foregoing possible channel encoding designs, the layer location index set M includes any one of the first layer to the $(\log_m N - 1)^{th}$ layer.

Further, the layer location index set M is determined based on the row location index set H.

A manner of determining the layer location index set M of the encoding diagram in the foregoing design is particularly important in determining the locations of the information bits in the encoding diagram. The locations of the information bits in the encoding diagram are determined in the foregoing determining manner, and further the transmit end determines the input bit sequence based on the locations of the information bits in the encoding diagram, especially the layer location index set of the to-be-encoded information bits in the encoding diagram. Then, an encoded bit sequence is obtained by performing encoding by using the new matrix. A bit error rate of the encoding method is effectively reduced, and performance of an encoding and decoding system is effectively improved.

In at least one embodiment, a design solution of the application further provides an encoding apparatus, including:

an input interface circuit, configured to obtain K to-be-encoded information bits, where K is an integer greater than or equal to 1;

a logic circuit, configured to generate a bit sequence $X_1^N$, where $X_1^N = u_1 N G'_N$, $u_1^N$ is a bit sequence obtained based on the K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$ and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \le H \le N$, and $0 < M \le \log_m N-1$; and an output interface circuit, configured to send the bit sequence $X_1^N$.

According to the encoding apparatus provided in the foregoing embodiment, the bit sequence $X_1^N$ is obtained and output by using $X_1^N = u_1^N G'_N$. Compared with an existing polar code encoding system, the output bit sequence $X_1^N$ is a bit sequence obtained by encoding $u_1^N$ by using the new matrix $G'_N$ and the new matrix $G'_N$ is a matrix generated based on the encoding generator matrix of the polar code and the locations of the K to-be-encoded information bits in the encoding diagram that has a mother code length of N. For the locations of the K to-be-encoded information bits in the encoding diagram that has a mother code length of N, not only locations of the information bits in the row index set of the encoding diagram are considered, but also locations of the information bits in the layer index set of the encoding diagram need to be considered. Particularly, a distribution design of the layer index set is considered. When the foregoing design solution is applied to an encoding process, a large quantity of simulation results prove that performance of an encoding side of the system is improved by reducing a bit error rate of the encoding system. Further, in a decoding process of the encoding method, whether a decoding algorithm is stopped in advance is determined based on cyclic redundancy check (CRC), so that decoding performance is improved, and a FAR on a decoding side is greatly reduced.

In at least one embodiment, the logic circuit provided in the design solution in the application is further configured to generate the new matrix $G'_N = BC + BC_{\bar{H}}$, where $$B = F_2^{\otimes M} \otimes \text{diag}\left(\text{ones}\left(\frac{N}{2^M}, 1\right)\right),$$

$C = F_2^{\otimes n}$ and $n = \log_2 N$.

In at least one embodiment, the logic circuit is further configured to obtain the bit sequence $u_1^N$, $u_1^N$ includes the K to-be-encoded information bits and N−K fixed bits, and the K to-be-encoded information bits are placed at locations, in the zeroth layer in the encoding diagram, corresponding to the row location index set H.

In at least one embodiment, the layer location index set M includes any one of the first layer to the $(\log_m, N-1)^{th}$ layer.

In at least one embodiment, the layer location index set M is determined based on the row location index set H.

A manner of determining, by the encoding apparatus, the layer location index set M of the encoding diagram in the foregoing design is particularly important in determining the locations of the information bits in the encoding diagram. The locations of the information bits in the encoding diagram are determined in the foregoing determining manner, and further the transmit end determines the input bit sequence based on the locations of the information bits in the encoding diagram, especially the layer location index set of the to-be-encoded information bits in the encoding diagram. Then, an encoded bit sequence is obtained by performing encoding by using the new matrix. A bit error rate of the encoding method is effectively reduced, and performance of an encoding and decoding system is effectively improved.

This application further provides an encoding apparatus, and the apparatus includes:

a processor, configured to generate a bit sequence $X_1^N$, where $X_1 N = u_1^N G'_N$, $u_1^N$ is a bit sequence obtained based on K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$ and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \le H \le N$, and $0 < M \le \log_m N-1$.

According to the encoding apparatus provided in the foregoing embodiment, the bit sequence $X_1^N$ is obtained and output by using $X_1^N = u_1^N G'_N$. Compared with an existing polar code encoding system, the output bit sequence $X_1^N$ is a bit sequence obtained by encoding $u_1^N$ by using the new matrix $G'_N$, and the new matrix $G'_N$ is a matrix generated based on the encoding generator matrix of the polar code and the locations of the K to-be-encoded information bits in the encoding diagram that has a mother code length of N. For the locations of the K to-be-encoded information bits in the encoding diagram that has a mother code length of N, not only locations of the information bits in the row index set of the encoding diagram are considered, but also locations of the information bits in the layer index set of the encoding diagram need to be considered. Particularly, a distribution design of the layer index set is considered. When the foregoing design solution is applied to an encoding process, a large quantity of simulation results prove that performance of an encoding side of the system is improved by reducing a bit error rate of the encoding system. Further, in a decoding process of the encoding method, whether a decoding algorithm is stopped in advance is determined based on cyclic redundancy check (CRC), so that decoding performance is improved, and a FAR on a decoding side is greatly reduced.

Further, the processor provided in the design is further configured to generate the new matrix $G'_N = BC + BC_{\bar{H}}$, where $$B = F_2^{\otimes M} \otimes \mathrm{diag}\left(\mathrm{ones}\left(\frac{N}{2^M}, 1\right)\right),$$

$C = F_2^{\otimes n}$, and $n = \log_2 N$.

Further, the processor provided in the design is further configured to obtain the bit sequence $u_1^N$, $u_1^N$ includes the K to-be-encoded information bits and N−K fixed bits, and the K to-be-encoded information bits are placed at locations, in the zeroth layer in the encoding diagram, corresponding to the row location index set H.

Further, in the foregoing design, the layer location index set M of the information bits in the encoding diagram includes any one of the first layer to the $(\log_m N-1)^{th}$ layer.

Further, in the foregoing design, the layer location index set M of the information bits in the encoding diagram is determined based on the row location index set H.

A manner of determining, by the encoding apparatus, the layer location index set M of the encoding diagram in the foregoing design is particularly important in determining the locations of the information bits in the encoding diagram. The locations of the information bits in the encoding diagram are determined in the foregoing determining manner, and further the transmit end determines the input bit sequence based on the locations of the information bits in the encoding diagram, especially the layer location index set of the to-be-encoded information bits in the encoding diagram. Then, an encoded bit sequence is obtained by performing encoding by using the new matrix. A bit error rate of the encoding method is effectively reduced, and performance of an encoding and decoding system is effectively improved.

The design further provides another encoding apparatus, and the apparatus includes:

a memory, configured to store a program instruction; and a processor, configured to: execute the program stored in the memory, and generate a bit sequence $X_1^N$ when the program is executed, where $X_1^N = u_1^N G'_N$, $u_1^N$ is a bit sequence obtained based on K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$, and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_2 N-1$.

The memory provided above may be a physically independent unit, or may be integrated with the processor.

In another design, the memory is located outside the encoding apparatus, and the encoding apparatus is connected to the memory by using a circuit/wire, and is configured to read and execute the program stored in the memory.

A manner of determining, by the encoding apparatus, the layer location index set M of the encoding diagram in the foregoing design is particularly important in determining the locations of the information bits in the encoding diagram. The locations of the information bits in the encoding diagram are determined in the foregoing determining manner, and further the transmit end determines the input bit sequence based on the locations of the information bits in the encoding diagram, especially the layer location index set of the to-be-encoded information bits in the encoding diagram. Then, an encoded bit sequence is obtained by performing encoding by using the new matrix. A bit error rate of the encoding method is effectively reduced, and performance of an encoding and decoding system is effectively improved.

A design solution provided in the application further provides an encoding apparatus, and the apparatus includes:

a transceiver, configured to receive K to-be-encoded information bits and send a bit sequence $X_1^N$, where K is an integer greater than or equal to 1; and a processor, configured to generate the bit sequence $X_1^N$, where $X_1^N = u_1^N G'_N$, $u_1^N$ is a bit sequence obtained based on the K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$ and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_m N-1$.

A design solution provided in the application may further provide an encoding apparatus, including:

a receiving module, configured to obtain K to-be-encoded information bits, where K is an integer greater than or equal to 1;

an encoding module, configured to generate a bit sequence $X_1^N$, where $X_1^N = u_1^N G'_N$, $u_1^N$ is a bit sequence obtained based on the K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$ and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, 0≤H≤N, and 0<M≤log$_m$ N−1; and a sending module, configured to send the bit sequence $X_1^N$.

The encoding apparatus is a base station or a terminal.

The application further provides an encoding and decoding system. The system includes a network device and a terminal device, where the network device includes any one of the foregoing encoding apparatuses; or the terminal device includes any one of the foregoing encoding apparatuses.

BRIEF DESCRIPTION OF DRAWINGS

FIG. 17-1 to FIG. 17-10 are activity factor diagrams 17-1 to 17-10 according to an embodiment of the application.

DESCRIPTION OF EMBODIMENTS

The following describes technical solutions of the application with reference to accompanying drawings.

Figure 1:
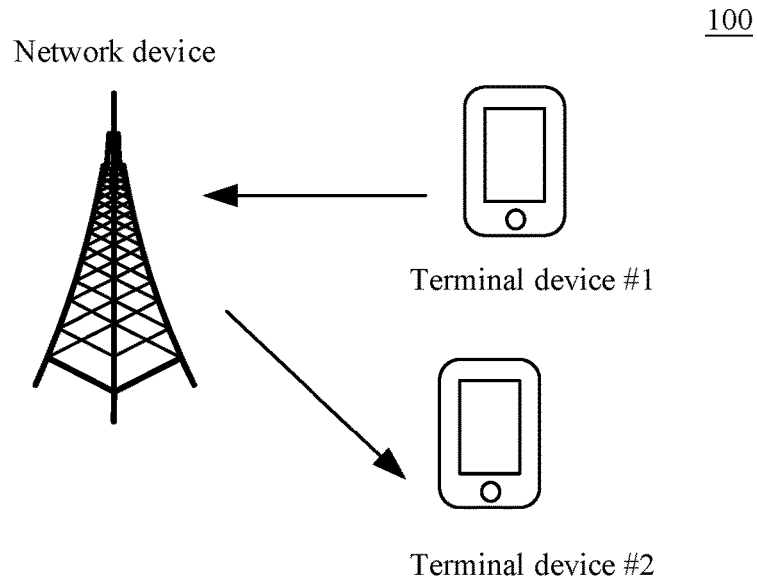
FIG. 1 shows a wireless communications system applicable to an embodiment of the application.

FIG. 1 shows a wireless communications system 100 applicable to an embodiment of the application. The wireless communications system may include at least one network device. The network device communicates with one or more terminal devices (for example, a terminal device #1 and a terminal device #2 shown in FIG. 1). The network device may be a base station, may be a device obtained after a base station and a base station controller are integrated, or may be another device having a similar communication function.

The wireless communications system mentioned in the embodiments of the application includes but is not limited to an internet of things communications system, a long term evolution (LTE) system, and a 5G mobile communications system in three application scenarios (e.g, enhanced mobile broadband (eMBB), ultra-reliable low-latency communication (URLLC), and enhanced machine type communication (eMTC)), or a new communications system that appears in the future.

The terminal device in the embodiments of the application may include various handheld devices, vehicle-mounted devices, wearable devices, or computing devices that have a wireless communication function, or other processing devices connected to a wireless modem. The terminal device may be a mobile station (MS), a subscriber unit, a cellular phone, a smartphone, a wireless data card, a personal digital assistant (PDA) computer, a tablet computer, a wireless modem (modem), a handheld device (handset), a laptop computer, a machine type communication (MTC) terminal, or the like.

A wireless technology is used for communication between the network device and the terminal devices in FIG. 1. When sending a signal, the network device is an encoder; when receiving a signal, the network device is a decoder. Similarly, when sending a signal, the terminal device is an encoder; when receiving a signal, the terminal device is a decoder.

Figure 2:
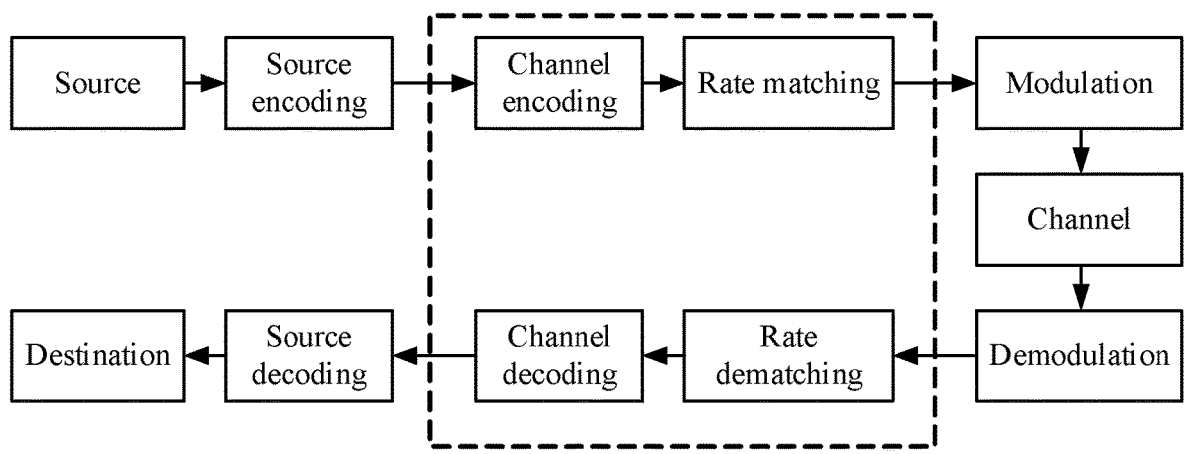
FIG. 2 is a basic flowchart of communication performed by using a wireless technology.

FIG. 2 is a basic flowchart of communication performed by using a wireless technology. At a transmit end, information is sent after source encoding, channel encoding, rate matching, and modulation are sequentially performed on the source. At a receive end, the information arrives at a destination after demodulation, rate de-matching, channel decoding, and source decoding are sequentially performed.

For ease of understanding, channel encoding in the application is first briefly described.

Channel encoding/decoding is one of core technologies in the wireless communications field, and performance improvement of the technology directly enhances network coverage and increases a user transmission rate. Currently, a polar code is a channel encoding technology that is theoretically proved to be capable of achieving a Shannon capacity and that has practical encoding and decoding capabilities with linear complexity. A core of the polar code is to use "channel polarization". On an encoding side, subchannels present different reliability by encoding. When a code length continuously increases, some channels tend to become noiseless channels having a capacity close to 1, and some other channels tend to become pure noisy channels having a capacity close to 0. A channel having a capacity close to 1 is selected and information is directly transmitted on the channel, to approach the channel capacity.

The encoding policy provided in the application exactly takes advantage of a feature of this phenomenon, and a noiseless channel or a low-noise channel is used to transmit useful information of a user, and a pure noisy channel is used to transmit agreed information or transmit no information. Code provided in the application is also a linear block code. An encoding matrix (also referred to as a generator matrix) of the linear block code may be based on an existing matrix $F_N$, and an encoding process is $X_1^N = D_1^N F_N$, to obtain a bit sequence $X_1^N$. $F_N$ is an N×N matrix, $F_N=F_2^{\otimes(\log_2(N))}$, $F_N$ is a Kronecker product of $\log_2$ N matrices $F_2$, and $$F = \begin{bmatrix} 10 \\ 11 \end{bmatrix};$$

N is a length of a mother code, $D_1^N$ is a bit sequence obtained after an input bit sequence $u_1^N$ is encoded based on locations of K to-be-encoded information bits in an encoding diagram that has a mother code length of N, and $u_1^N$ is N bit sequences generated based on the K to-be-encoded information bits; K is an integer greater than or equal to 1, N is an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, 0≤H≤N, and 0<M≤$\log_m$ N−1.

In the foregoing encoding process, some bits in $u_1^N$ are used to carry information and are referred to as an information bit set. A set of indexes of these bits is denoted as A. Some other bits are set to fixed values that are pre-agreed on by the receive end and the transmit end, and are referred to as a fixed bit set or a frozen bit (frozen bits) set. A set of indexes of these bits is represented by using a complementary set $A^c$ of A. A quantity of fixed bits in the set in $u_1^N$ is (N−K), and the fixed bits are bits known by both the transmit end and the receive end. The fixed bits are generally set to 0. However, the fixed bits may be set randomly provided that the receive end and the transmit end have pre-agreed.

Based on the foregoing descriptions, the embodiments of the application provide a channel encoding method and apparatus, and a system, to improve error correction performance of the polar code in higher-order modulation, to meet a FAR requirement. The channel encoding method and apparatus provided in the application are described in detail below with reference to the accompanying drawings.

Figure 3:
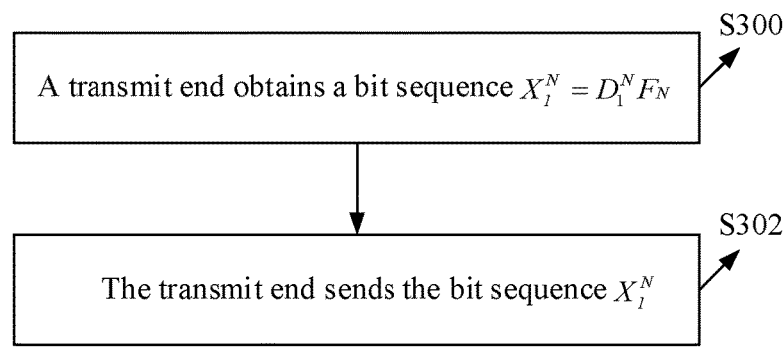
FIG. 3 is a flowchart of an embodiment of a channel encoding method according to an embodiment of the application.

FIG. 3 is a flowchart of an embodiment of a channel encoding method according to the application. As shown in FIG. 3, an executive body of the embodiment is a transmit end, and the channel encoding method in the embodiment may include the following operations.

S300. The transmit end obtains a bit sequence $X_1^N$, where $X_1^N=D_1^N F_N$.

$F_N$ is an N×N matrix, $F_N=F_2^{\otimes(\log_2(N))}$, $F_N$ is a Kronecker product of $\log_2$ N matrices $F_2$, and $$F = \begin{bmatrix} 10 \\ 11 \end{bmatrix};$$

N is a length of a mother code, $D_1^N$ is a bit sequence obtained after an input bit sequence $u_1^N$ is encoded based on locations of K to-be-encoded information bits in an encoding diagram that has a mother code length of N, and $u_1^N$ is N bit sequences generated based on the K to-be-encoded information bits; K is an integer greater than or equal to 1, N is an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, 0≤H≤N, and 0<M≤$\log_m$ N−1.

$u_1^N$ includes the K to-be-encoded information bits and N−K fixed bits, and the K to-be-encoded information bits are placed at locations, in the zeroth layer in the encoding diagram, corresponding to the row location index set H.

The fixed bits are values pre-agreed on by a receive end and the transmit end. These pre-agreed values may also be referred to as frozen bits, and may be 0.

An information bit is a bit used to carry information, and the information may include any one or a combination of the following: data information, signaling information, or check information, for example, power control information, uplink scheduling grant information, resource block resource allocation information, cyclic redundancy check (CRC), parity check (PC), or any other check information.

Further, $D_1^N$ includes a bit sequence $C_1^N$ and a fixed bit, and the bit sequence $C_1^N$ is a bit sequence obtained after polar encoding is performed on $u_1^N$ based on the encoding diagram.

Further, the layer location index set M includes any one of the first layer to the $(\log_m N-1)^{th}$ layer; or the layer location index set M is determined based on the row location index set H.

S302. The transmit end sends the bit sequence $X_1^N$.

Further, the foregoing process of obtaining the bit sequence $X_1^N$ by the transmit end relates to the locations of the K to-be-encoded information bits in the encoding diagram that has a mother code length of N. In at least one embodiment, a process of determining the locations of the K to-be-encoded information bits in the encoding diagram that has a mother code length of N is as follows:

First, the transmit end obtains the encoding diagram that has a mother code length of N.

The encoding diagram includes M' layers and H' rows. M' layers are equal to ($\log_m$ N+1) layers, which are the zeroth layer layer 0, the first layer layer 1, ..., and the (M'−1)$^{th}$ layer layer $\log_m$ N. H' rows are the zeroth row, ..., and the (N−1)$^{th}$ row, where N is an integer power of m, and m is a positive integer greater than 1.

Figure 4:
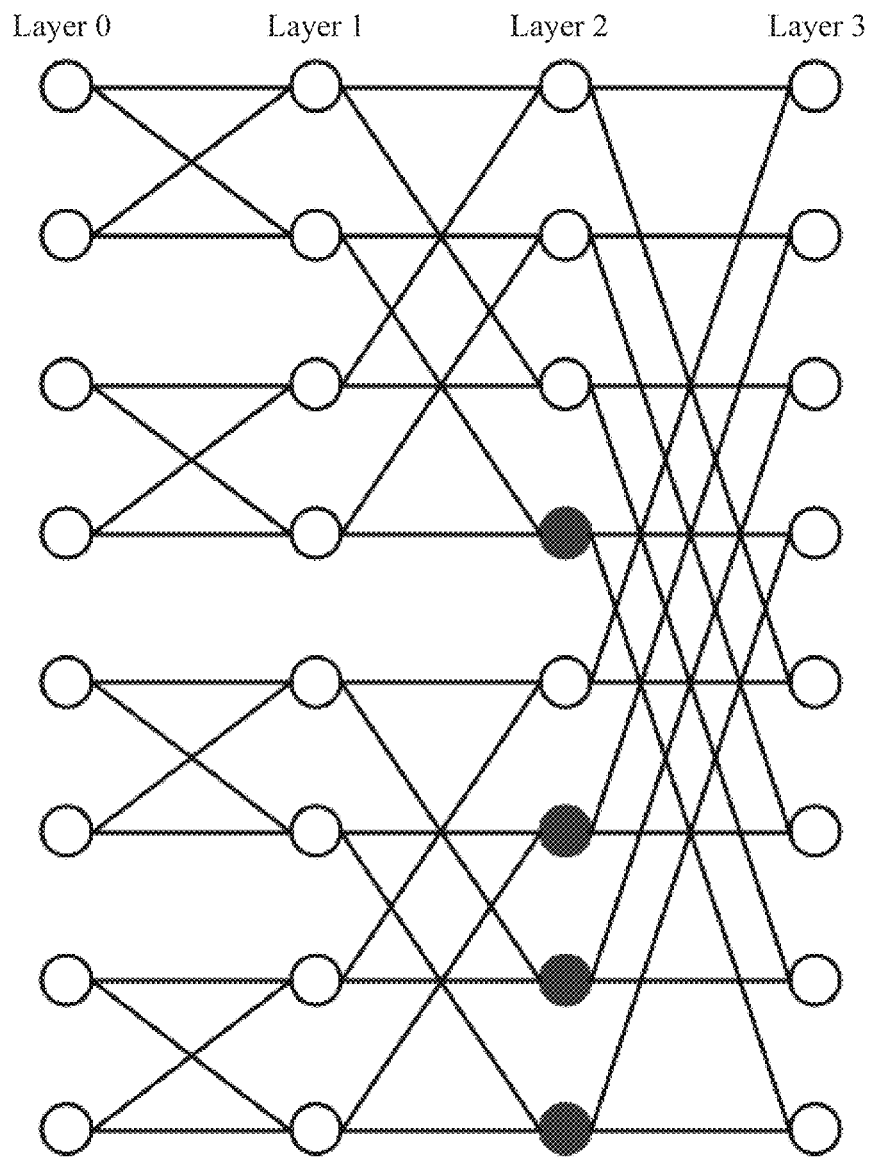
FIG. 4 is an encoding diagram according to an embodiment of the application.

An encoding diagram with an encoding length of N that is 8 is used as an example. As shown in FIG. 4, when m=2 and N=8, in the encoding diagram, M'=4 and H'=8, and the M' layers are $\{L_0, L_1, L_2, L_3\}$, and the H' rows are $\{h_0, h_1, h_2, h_3, h_4, h_5, h_6, h_7\}$.

Then, the transmit end determines the locations of the K to-be-encoded information bits in the encoding diagram based on the foregoing encoding diagram. The locations of the K to-be-encoded information bits in the encoding diagram that has a mother code length of N include the row location index set H of the information bits in the encoding diagram and the layer location index set M of the information bits in the encoding diagram, where H⊂H', M⊂M', 0≤H≤N, and 0≤M≤$\log_m$ N−1.

Because the locations of the information bits in the encoding diagram determine performance of channel encoding, in addition to determining the row location index set of the information bits in the encoding diagram, the determining the locations of the information bits in the encoding diagram further includes determining the layer location index set of the information bits in the encoding diagram. The following further describes, by using an example, a plurality of implementations of the process of determining the locations of the information bits in the encoding diagram.

In an embodiment, the process of determining the locations of the information bits in the encoding diagram is implemented in two operations: First, a row, of the encoding diagram, in which the information bits are placed is selected; second, a layer, of the selected row, in which the information bits are placed is further determined.

In at least one embodiment, the transmit end may determine, by using any one or a combination of the following one or more manners, the row location index set H in which the information bits are located: For example, the row location index set is determined based on a polarization weight (PW) sequence, a bar-type parameter, Gaussian approximation, or the like. Herein, the determining the row location index set H in which the information bits are located is the prior art, and details are not described herein again.

Using FIG. 4 as an example, based on the foregoing determining method, the row location index set H of the information bits in the encoding diagram is $\{h_3, h_5, h_6, h_7\}$. It may be understood that the four to-be-encoded information bits are separately located in the third row, the fifth row, the sixth row, and the seventh row of the encoding diagram in FIG. 4.

Further, the transmit end determines the layer location index set M of the information bits in the encoding diagram in the following several manners, and examples are as follows:

Example 1: The layer location index set M of the K to-be-encoded information bits in the encoding diagram includes any one of the first layer to the $(\log_m N-1)^{th}$ layer.

In at least one embodiment, the transmit end selects any one of layers from a layer location index set M' of the encoding diagram as the layer location index set M, and a preferred manner is selecting one layer L from the first layer to the $(\log_m N-1)^{th}$ layer of the M' and determining that the layer location index set M in which the K to-be-encoded information bits are located is {L}. It should be noted that because all the to-be-encoded information bits are placed in one layer herein, there is only one element in the determined set M, that is, the layer L.

Using FIG. 4 as an example, the transmit end selects, from the layer 0 to the layer 3, the layer 2 to place the four to-be-encoded information bits, that is, the layer location index set L in which the information bits are located is the layer 2. It can be learned from simulation results that when the information bits are placed in right layers, bit error rate performance in encoding can be greatly improved by using the encoding scheme, and false alarm rate performance in decoding is also greatly improved after the receive end receives the information bits.

With reference to the determining of the row location index, the third row of the layer 2, the fifth row of the layer 2, the sixth row of the layer 2, and the seventh row of the layer 2 may be determined as the locations of the four to-be-encoded information bits in the encoding diagram. As shown in FIG. 4, four shadow circles of the layer 2 separately indicate the locations of the four information bits in the encoding diagram. That is, the locations of the four to-be-encoded information bits in the encoding diagram include the row location index set H $\{h_3, h_5, h_6, h_7\}$ and the layer location index set M $\{L_2\}$.

Example 2: The manner in which the transmit end determines the layer location index set M of the information bits in the encoding diagram may be: The layer location index set M is determined based on the row location index set H.

In at least one embodiment, first, the transmit end selects one layer L from the layer location index set M', and determines the layer L as a layer index corresponding to a row index h in which any information bit in the row location index H is located, where h∈H.

Then, the transmit end traverses h in the row location index set H, to determine the layer location index set M in which all the K to-be-encoded information bits are located.

Figure 5:
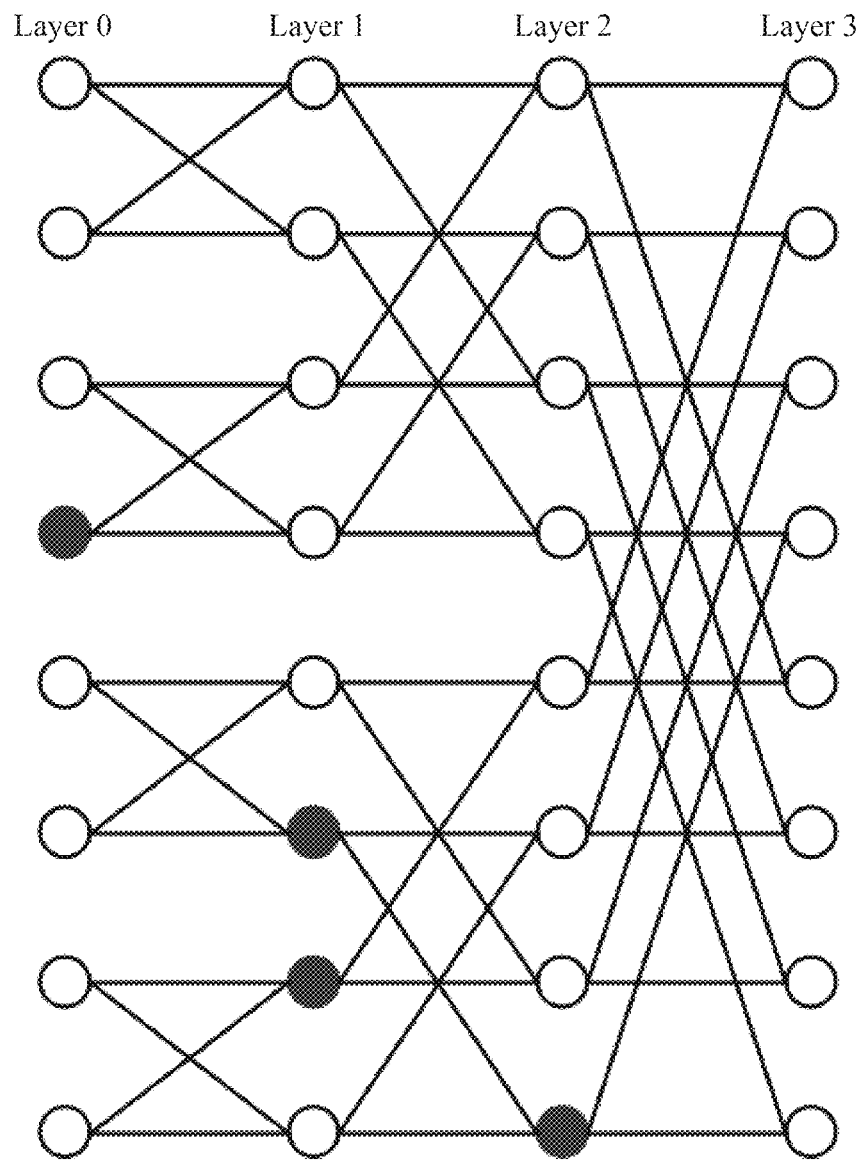
FIG. 5 is another encoding diagram according to an embodiment of the application.

In FIG. 5, four to-be-encoded information bits are used as an example. The transmit end determines, in the foregoing manner of determining the row index location, that a row index set H in which the four to-be-encoded information bits are located is $\{h_3, h_5, h_6, h_7\}$.

The transmit end first determines a row index in which an information bit, of the four to-be-encoded information bits, corresponding to the row index $h_3$ in the encoding diagram is located: The transmit end may select any one layer from the layer 0 to the layer 3 in the encoding diagram, and preferably, the layer 0 and the layer 3 are not selected, that is, the transmit end selects one layer from the layer 1 and the layer 2 in the encoding diagram. As shown in FIG. 5, the transmit end selects the layer 0 as a layer index location that is in the encoding diagram and in which one of the information bits is located, that is, a location set of the information bit in the encoding diagram is $\{L_0, h_3\}$. Then, the transmit end traverses h in H, and sequentially determines a layer index set M, in the encoding diagram, of information bits corresponding to the remaining $h_5$, $h_6$, and $h_7$. As shown in FIG. 5, the transmit end sequentially determines that the layer index set M, in the encoding diagram, of the information bits corresponding to the remaining $\{h_5, h_6, h_7\}$ is $\{L_0, L_1, L_2\}$.

As shown in FIG. 5, locations of the four information bits in the encoding diagram include a row location index set H $\{h_3, h_5, h_6, h_7\}$ and a layer location index set M $\{L_0, L_1, L_2\}$. Black circles in FIG. 5 separately indicate that the locations of the four to-be-encoded information bits are separately distributed in the third row of the layer 0, the fifth row and the seventh row of the layer 1, and the seventh row of the layer 2.

Alternatively, the manner in which the transmit end determines the layer location index set M of the information bits in the encoding diagram may be:

Example 3: For an embodiment of the foregoing example 2:

For each h in the row location index set H of the information bits, the transmit end calculates a layer index L of each information bit by using the following formula, where the formula is a function related to h.

The foregoing function related to h may be: $L=\text{ceil}(\log_2(\text{rem}(h, 2^m)+1))$. L is obtained through calculating, and m is an integer and is generally any value of 2, 3, or 4. h is a layer index corresponding to a row index h, in which any information bit is located, in the row location index H. The rem function is a function for calculating a remainder of dividing h by $2^m$, for example, rem(5, 2)=1, and the ceil function is a function for calculating a smallest integer greater than a number in brackets, for example, ceil(2.5)=3. The layer index L of the information bit of each h may be obtained by using the foregoing formula.

It should be noted that, in the foregoing process of determining the location of the information bit on a subchannel, a sequence of determining, by the transmit end, the row location index of the information bit on the subchannel and determining the layer location index of the information bit on the subchannel is not particularly limited. In the foregoing embodiment, alternatively, the transmit end may first determine the layer location index of the information bit on the subchannel, and then determine the row location index of the information bit on the subchannel.

The foregoing process implements the process of determining the locations of the to-be-sent information bits in the encoding diagram. On an encoding side, the information bits are encoded based on the locations of the to-be-sent information bits in the encoding diagram, especially the row location indexes of the information bits in the encoding diagram. Simulation results show that the encoding scheme can greatly improve a bit error rate of an encoding system.

Based on the foregoing manner of determining the locations of the K to-be-encoded information bits in the encoding diagram, it can be learned that: For the locations of the information bits, not only the row location indexes of the information bits in the encoding diagram are considered, but also the layer location indexes of the information bits in the encoding diagram need to be considered; particularly, the information bits are distributed in different layer indexes. In encoding of a bit sequence encoded based on the channel encoding diagram, the bit error rate (BER) of the system is reduced, and further a FAR is also reduced when the receive end performs decoding by using the encoded bit sequence.

The foregoing is a process of determining, by the transmit end, the locations of the to-be-sent information bits in the encoding diagram. The transmit end further performs polar code encoding on the information bits based on the locations of the information bits in the encoding diagram.

The following describes, with reference to the locations of the information bits in the encoding diagram, the process of encoding the information bits.

Using FIG. 6 as an example, an implementation process of obtaining an input bit sequence $u_1^N$ by a transmit end is first described as follows:

Operation 1: The transmit end places K to-be-encoded information bits at locations, in the zeroth layer in the encoding diagram, corresponding to a row location index set H.

Figure 6:
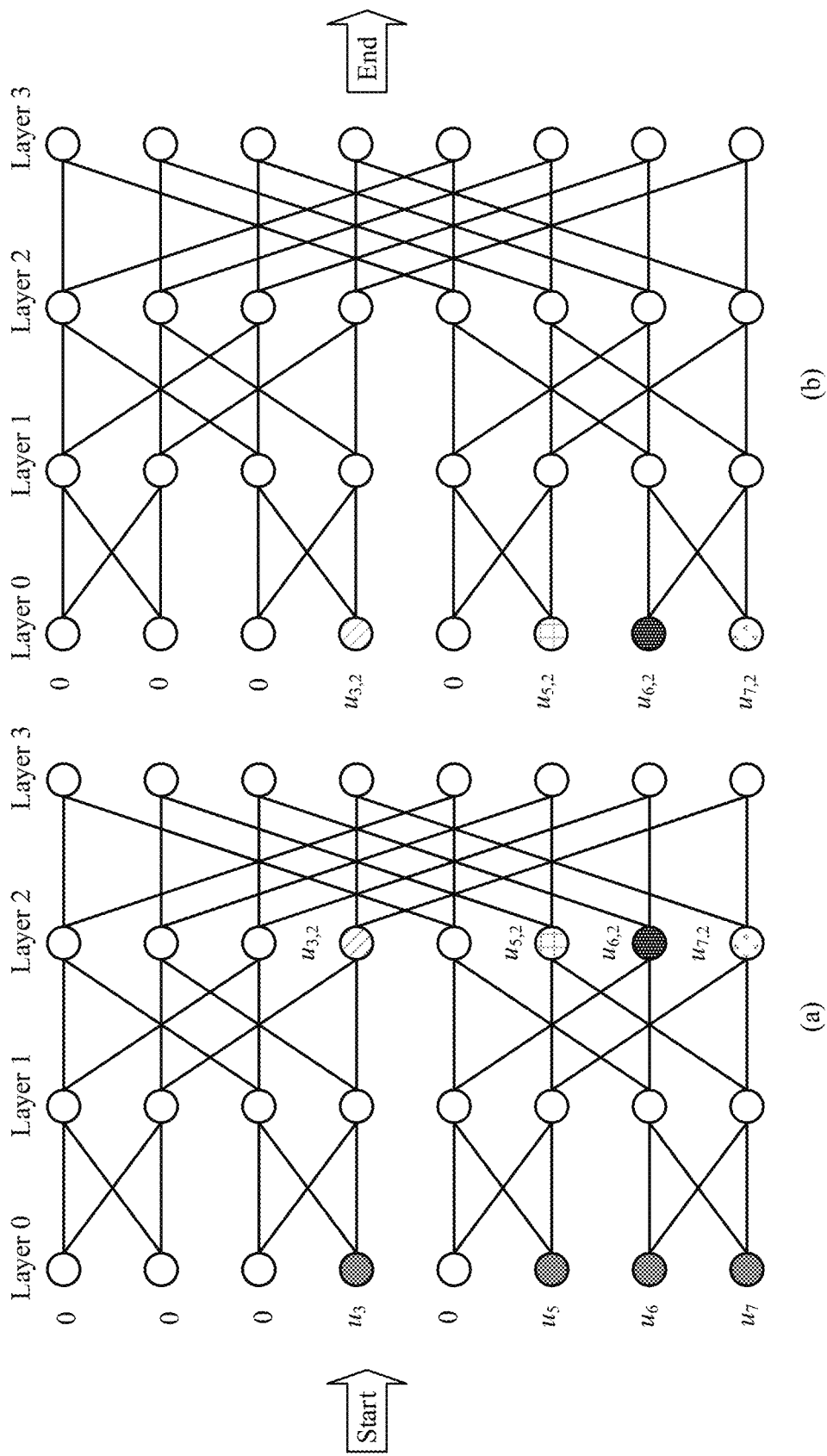
FIG. 6 is a schematic diagram of channel encoding according to an embodiment of the application.

It should be noted herein that, based on the foregoing descriptions of the locations of the information bits in the encoding diagram, FIG. 6 is used as an example, K=4, and locations corresponding to the four to-be-encoded information bits in the encoding diagram are separately $\{h_3, L_2\}$, $\{h_5, L_2\}$, $\{h_6, L_2\}$, and $\{h_7, L_2\}$. However, in encoding, for an encoder at the transmit end, encoding is generally started, corresponding to FIG. 6(a), from the layer 0. Therefore, the transmit end separately places, based on the locations of the information bits in the encoding diagram, especially the row location index set H of the information bits in the encoding diagram, the information bits at the $h_3$ location of the $L_0$ layer, the $h_5$ location of the layer $L_0$, the $h_6$ location of the $L_0$ layer, and the $h_7$ location of the layer $L_0$ in FIG. 6.

The input bit sequence $u_1^N$ of the transmit end herein includes encoded bits corresponding to the layer 0 in FIG. 6, and includes the K to-be-encoded information bits and fixed bits (which are provided in operation 2).

Operation 2: The transmit end sets values of other bit locations in the layer 0 to fixed bits.

Operation 3: The transmit end obtains the bit sequence $u_1^N$ based on the to-be-encoded information bits and the fixed bits.

It should be noted that a sequence of operation 1 and operation 2 may be changed, and is not limited.

The foregoing determining process may be the foregoing operation: The K to-be-encoded information bits are placed at the locations, in the layer 0 in the encoding diagram, corresponding to H; or it may be understood that bits, corresponding to the row index set H in the encoding diagram, of the to-be-sent information bits are placed at the locations, in the layer 0, corresponding to H, to obtain the input bit sequence $u_1^N$.

For example, as shown in FIG. 6, FIG. 6(a) is an encoding diagram of four layers and eight rows: M' is $\{0, 1, \ldots, 3\}$, including the zeroth layer layer 0, the first layer layer 1, the second layer layer 2, and the third layer layer 3; and H' is $\{0, 1, \ldots, 7\}$. Location sets of the four to-be-encoded information bits on subchannels may also be represented as: M is $\{L_2\}$, and H is $\{h_3, h_5, h_6, h_7\}$.

A specific process of obtaining $u_1^N$ by the transmit end is as follows:

One manner may be:

As shown in FIG. 6(a), the transmit end places, based on the row index set H $\{h_3, h_5, h_6, h_7\}$ of the information bits in the encoding diagram, the to-be-sent information bits $\{1, 1, 0, 1\}$ at locations corresponding to $\{h_3, h_5, h_6, h_7\}$ in the layer 0 in FIG. 6(a).

Another manner may be understood as:

It can be learned from FIG. 6(a) that, the locations of the four to-be-encoded information bits in the encoding diagram are: M is $\{L_2\}$, and H is $\{h_3, h_5, h_6, h_7\}$. The transmit end places bit values $\{u_{3,2}, u_{5,2}, u_{6,2}, u_{7,2}\}$ (a sequence of a subscript row index and layer index is not limited, the values may also be represented as $\{u_{2,3}, u_{2,5}, u_{2,6}, u_{2,7}\}$) of $\{h_3, h_5, h_6, h_7\}$ in the layer 2 on $\{u_3, u_5, u_6, u_7\}$ corresponding to the row location index set H of the layer 0. For example, if corresponding values of the set $\{h_3, h_5, h_6, h_7\}$ is set to $\{1, 1, 0, 1\}$, $\{h_3, h_5, h_6, h_7\}$ of the layer 2 corresponds to $\{u_3, u_5, u_6, u_7\}$ of the layer 0, so that $\{u_3, u_5, u_6, u_7\}=\{1, 1, 0, 1\}$.

Further, the transmit end sets other variable nodes of the layer 0 to fixed values, for example, all-0 values.

Finally, the encoded sequence $u_1^N$ generated by the transmit end based on the information bits and the fixed bits is $\{0, 0, 0, 1, 0, 1, 0, 1\}$.

It should be noted that a butterfly operation process of a polar code is also performed from the layer 0. Therefore, when the transmit end performs encoding, the to-be-encoded information bits are generally placed at the locations corresponding to H of the layer 0. Then, an encoded bit sequence $u_1^N$ with a mother code of N is generated, and polar code encoding is further performed. The input bit sequence $u_1^N$ herein may be conveniently understood as N bit sequences of the layer 0 in FIG. 6(a).

Then, the transmit end performs polar encoding on the input bit sequence $u_1^N$ to obtain a bit sequence $C_1^N$.

As shown in FIG. 6(a), the transmit end sequentially performs an operation, for example, a butterfly operation, on the obtained bit sequence $u_1^N$ from left to right, until it is calculated that M is corresponding N bit values in a layer $\{L_2\}$, that is, the encoded sequence $C_1^N$ is output. Herein, $C_1^N$ may be conveniently understood as the N bit sequences of the layer 2.

It should be noted that the foregoing process of performing polar encoding on $u_1^N$ is a part of an existing polar code encoding process. Herein, preferably, the transmit end performs, based on the locations of the K to-be-encoded information bits in the encoding diagram, the butterfly operation on $u_1^N$ from the layer 0, until it is calculated that M is the layer $\{L_2\}$, and the bit sequence $C_1^N$ is output. M is a layer index location of the information bits in the foregoing encoding diagram. As shown in FIG. 6(a), if the bit sequence $u_1^N$ corresponding to the layer 0 is $\{0, 0, 0, 1, 0, 1, 0, 1\}$, the bit sequence $C_1^N$ that corresponds to the layer 2 and that is obtained by performing the butterfly operation on $u_1^N$ from the layer 0 to the layer 2 may be $\{1, 1, 0, 1, 0, 1, 1, 1\}$. The foregoing polar encoding process is a part of the existing polar encoding. For a specific polar encoding process, refer to descriptions of polar encoding in the prior art or in a standard. Details are not described herein again.

Then, the transmit end obtains the bit sequence $D_1^N$ based on $C_1^N$.

Herein, this may be simply understood as a process of secondary polar encoding. As shown in FIG. 6(b), the bit sequence $D_1^N$ corresponds to the layer 0 in FIG. 6(b), and $D_1^N$ includes bits corresponding to a row index H in $C_1^N$ and fixed bits.

A specific operation may be as follows: The transmit end places values of locations of the bits corresponding to the row index H of $C_1^N$ to bit locations corresponding to a row location index set H of the zeroth layer in FIG. 6(b), sets values of other bit locations of the zeroth layer to fixed bits, and outputs the bit sequence $D_1^N$.

In at least one embodiment, as shown in FIG. 6(a), $C_1^N$ is $\{1, 1, 0, 0, 1, 0, 1, 1, 1\}$, and the transmit end places values $\{1, 0, 1, 0\}$ of a row index set $\{h_3, h_5, h_6, h_7\}$ at corresponding locations in the row location index set H $\{h_3, h_5, h_6, h_7\}$ of the layer 0 in FIG. 6(b). Then, the transmit end sets bit values corresponding to other locations $\{h_0, h_1, h_2, h_4\}$ in the layer 0 to fixed bits, for example, all-0 bits $\{0, 0, 0, 0\}$. As shown in FIG. 6(b), a bit sequence set, of the bit sequence $D_1^N$, obtained by the transmit end is $\{0, 0, 0, 1, 0, 0, 1, 0\}$.

In the foregoing process of encoding $D_1^N$, a sequence of determining, by the transmit end, the fixed bits in the layer 0 and determining the bits corresponding to H in the layer 0 is not limited.

Finally, the transmit end obtains an encoded bit sequence $X_1^N$ based on $D_1^N$ by using a formula $X_1^N = D_1^N F_N$.

In at least one embodiment, the transmit end sequentially performs calculation, for example, a butterfly operation, on the obtained bit sequence $D_1^N$ from left to right, and outputs the encoded bit sequence. As shown in FIG. 6(b), for example, the transmit end performs, based on $D_1^N$, calculation from the layer 0 to the last layer, that is, the layer 3, by using the butterfly operation, and outputs the corresponding bit sequence $X_1^N$ that is of the information bits and that is in the layer 3. The foregoing polar encoding process is an existing polar encoding technology. For a specific polar encoding process, refer to descriptions of polar encoding in the prior art or in a standard. Details are not described herein again.

The foregoing process of performing polar encoding on the $D_1^N$ may also be understood as $X_1^N = D_1^N F_N$, where $F_N$ is an N×N matrix, $F_N = F_2^{\otimes (\log_2(N))}$, $F_N$ is a Kronecker product of $\log_2 N$ matrices $F_2$ and $$F = \begin{bmatrix} 1 & 0 \\ 1 & 1 \end{bmatrix}.$$

The transmit end multiplies the binary row vector $D_1^N$ of 1×N by the N×N matrix $F_N$, and outputs the 1×N binary row vector $X_1^N$.

It should be noted that, in the foregoing process of determining the encoded sequence, there is no limitation on a sequence of determining the bits, corresponding to the information bits, of the row location index and determining the fixed bits, and the fixed bits may be first determined and then the values, corresponding to the information bits, of the row location index are determined.

Optionally, the obtaining the bit sequence by the transmit end in S300 mentioned above may alternatively be implemented by using the formula below. The following uses FIG. 6 as an example to describe FIG. 6(a) and FIG. 6(b).

Operation 1: Obtain an input bit sequence $u_1^N$, where $u_1^N$ is a binary row vector and has a length of N.

For details, refer to the foregoing specific descriptions. Details are not described herein again.

Operation 2: The transmit end obtains $C_1^N$ based on $u_1^N$ by using a formula $$C_1^N = u_1^N \left( F_2^{\otimes M} \otimes \text{diag}\left(\text{ones}\left(\frac{N}{2^M}, 1\right)\right)\right),$$

where:

$u_1^N = (u_1, u_2, \ldots, u_N)$ is a 1×N binary row vector; $F_2^{\otimes M}$ represents a Kronecker product of M matrices $F_2$, and a $2^M \times 2^M$ matrix is output, where M is a layer index set of subchannels on which to-be-encoded information bits are located;

$$\text{ones}\left(\frac{N}{2^M}, 1\right)$$

represents $$\frac{N}{2^M}$$

all-1 vectors, $$\text{diag}\left(\text{ones}\left(\frac{N}{2^M}, 1\right)\right)$$

is a $$\frac{N}{2^M} \times \frac{N}{2^M}$$

diagonal matrix generated by placing input vectors, for example, all-1 vectors, on a diagonal line; and Kronecker multiplication is performed on $F_2^{\otimes M}$ and $$\text{diag}\left(\text{ones}\left(\frac{N}{2^M}, 1\right)\right),$$

and an N×N matrix is output.

In at least one embodiment, the transmit end performs, based on $$C_1^N = u_1^N \left( F_2^{\otimes M} \otimes \text{diag}\left(\text{ones}\left(\frac{N}{2^M}, 1\right)\right)\right),$$

matrix multiplication on the input bit sequence $u_1^N$ and $$F_2^{\otimes M} \otimes \text{diag}\left(\text{ones}\left(\frac{N}{2^M}, 1\right)\right),$$

and outputs the encoded 1×N bit sequence $C_1^N$. For example, in FIG. 6(a), the bit sequence $C_1^N$ is {1, 1, 0, 0, 1, 1, 1, 0}.

Operation 3: The transmit end obtains a bit sequence $D_1^N$ based on bits corresponding to H in $C_1^N$ and fixed bits.

For example, in FIG. 6(a), the obtained $C_1^N$ is {1, 1, 0, 0, 1, 1, 1, 0}, values {0, 1, 1, 0} of a row location index set H {$h_3$, $h_5$, $h_6$, $h_7$} are taken from $C_1^N$, and {0, 1, 1, 0} are placed at bit locations corresponding to {$h_3$, $h_5$, $h_6$, $h_7$} in the layer 0 in FIG. 6(b).

Further, the transmit end sets values of other bit locations, other than the row location index set H, of the zeroth layer to fixed bits. As shown in FIG. 6(b), the transmit end sets values of other locations, that is, bit locations corresponding to {$h_0$, $h_1$, $h_2$, $h_4$}, in the layer 0 to fixed bits, for example, {0, 0, 0, 0}.

After the foregoing encoding, the obtained $D_1^N$ is {0, 0, 0, 0, 0, 1, 1, 0}.

Operation 4: The transmit end outputs an encoded bit sequence $X_1^N$ based on $D_1^N$ by using a formula $X_1^N = D_1^N F_N$.

In at least one embodiment, corresponding to the foregoing formula, the obtained $D_1^N$ is multiplied by $F^N$, and a 1×N matrix is output.

The $F^N$ is an N×N matrix, and $F_N = F_2^{\otimes(\log_2(N))}$. $F^N$ is defined as a Kronecker Kronecker product of $\log_2 N$ matrices $F_2$, and $$F = \begin{bmatrix} 1 & 0 \\ 1 & 1 \end{bmatrix}.$$

The foregoing corresponds to the process of performing polar encoding on $D_1^N$ in FIG. 6(b).

For example, in FIG. 6(b), the encoded bit sequence {0, 0, 0, 0, 0, 1, 1, 0} of the layer 0 is $D_1^N$. After polar encoding is performed on each layer, an encoded bit sequence of the last layer, that is, the layer 3, is obtained. To be specific, the encoded bit sequence $X_1^N$ is obtained.

The addition and multiplication operations in the foregoing formulas are all addition and multiplication operations in a binary Galois field, and then the encoded bit sequence $X_1^N$ is output.

In conclusion, in the process of obtaining the bit sequence $X_1^N$ in operation 1 to operation 4, the bit sequence $X_1^N$ may also be directly obtained by using the following formula:

$$X_1^N = \left\{ u_1^N \left( F_2^{\otimes M} \otimes \text{diag}\left(\text{ones}\left(\frac{N}{2^M}, 1\right)\right)\right)\right\}_H (F_2^{\otimes n})_H$$

$F_2^{\otimes n}$ represents a Kronecker product of n matrices $F_2$, and $2^n \times 2^n$ is output, where $N = 2^n$, that is, an N×N matrix is output.

$(F_2^{\otimes n})_H$ represents the $h^{th}$ row of the matrix $F_2^{\otimes n}$, and $(F_2^{\otimes n})_H$ is determined by determining $$((F_2^{\otimes n})_H)_h = \begin{cases} \text{zeros}(1, N)(h \notin H) \\ A_h (h \in H) \end{cases}.$$

If h belongs to a row index set H of information bits, a value of h in the row location index set H is determined for assignment; if h does not belong to the row index set H of the information bits, L pre-agreed fixed values, for example, all-0 values, are determined.

The foregoing $$((F_2^{\otimes n})_H)_h = \begin{cases} \text{zeros}(1, N)(h \notin H) \\ A_h (h \in H) \end{cases}$$

corresponds to the encoded bits in the layer 0 in FIG. 6(b), and may be simply expressed, in FIG. 6(b), as a process in which the transmit end determines a value of any one h in the row index set H of the layer 0. To be specific, when h is any one in the H set {$h_3$, $h_5$, $h_6$, $h_7$} of the information bits, that is, h∈H, a value corresponding to his placed into a corresponding value in the set {$h_3$, $h_5$, $h_6$, $h_7$}; if h is not any one in {$h_3$, $h_5$, $h_6$, $h_7$}, that is, h∉H, a bit corresponding to h is set to a fixed bit, for example, "0".

Using the bit sequence of the layer 0 in FIG. 6(b) as an example, when the transmit end determines a value corresponding to $h_3$ in the layer 0, because $h_3$ belongs to the H set of the information bits, the value of $h_3$ is set to a bit location corresponding to $h_3$ in $C_1^N$. Further, values of bit locations corresponding to $h_5$, $h_6$, and $h_7$ in the layer 0 are sequentially determined in the foregoing manner. When determining a value of $h_0$ in the layer 0, the transmit end first determines that $h_0$ does not belong to the H set of the information bits, and directly sets the value of $h_0$ in the layer 0 to a fixed bit, for example, 0. Then, values of $h_1$, $h_2$, and $h_4$ in the layer 0 are sequentially determined in the foregoing manner. It should be noted herein that, in the foregoing process of determining the fixed bit, values of other locations in the layer 0 may be set to fixed bits after bits corresponding to H of the layer 0 are first determined. This is not limited herein.

Further, the foregoing formula may be understood as: performing matrix multiplication on the input bit sequence $u_1^N$ and $$\left(F_2^{\otimes M} \otimes \text{diag}\left(\text{ones}\left(\frac{N}{2^M}, 1\right)\right)\right),$$

outputting $C_1^N$, obtaining $D_1^N$ by encoding $C_1^N$, and obtaining $X_1^N$ by using $X_1^N = D_1^N F_N$.

It should be noted that, in the foregoing formula, in $X_1^N = D_1^N F_N$, values corresponding to H rows of $D_1^N$ and $F_N$ are separately taken and then multiplied, which corresponds to FIG. 6(b), where H is 4. Herein, the transmit end takes four values from $D_1^N$ to generate a 1×4 binary row vector, correspondingly takes a 4×4 matrix from $F_N$, and then multiplies $(D_1^N)_H$ by $(F_N)_H$ The foregoing process of separately taking the values corresponding to H rows of $D_1^N$ and $F_N$ is for ease of description. Certainly, in the foregoing formula, $X_1^N = D_1^N F_N$ may also be same as that in FIG. 6(b): $D_1^N$ is still a 1×N matrix. However, a process of forming $D_1^N$ is the same as that in the foregoing embodiment, and details about outputting and forming a 1×N matrix are not described herein again.

In an embodiment of the foregoing encoding process, the output bit sequence $D_1^N$ is designed based on the locations of the K to-be-encoded information bits in the encoding diagram, and in particular, the layer location index set M of the information bits in the encoding diagram; polar encoding of a polar code is performed on $D_1^N$; the encoded bit sequence $X_1^N$ is output. The encoding method not only improves BER performance of an encoding device, but also improves FAR performance in decoding. The channel encoding method is particularly effective when a decoding device performs decoding.

An embodiment of the present disclosure further provides an encoding apparatus for encoding, configured to implement the channel encoding method in the foregoing embodiment. A part or all of the channel encoding method in the foregoing embodiment may be implemented by hardware or software. When the channel encoding method is implemented by hardware, refer to FIG. 7.

Figure 7:
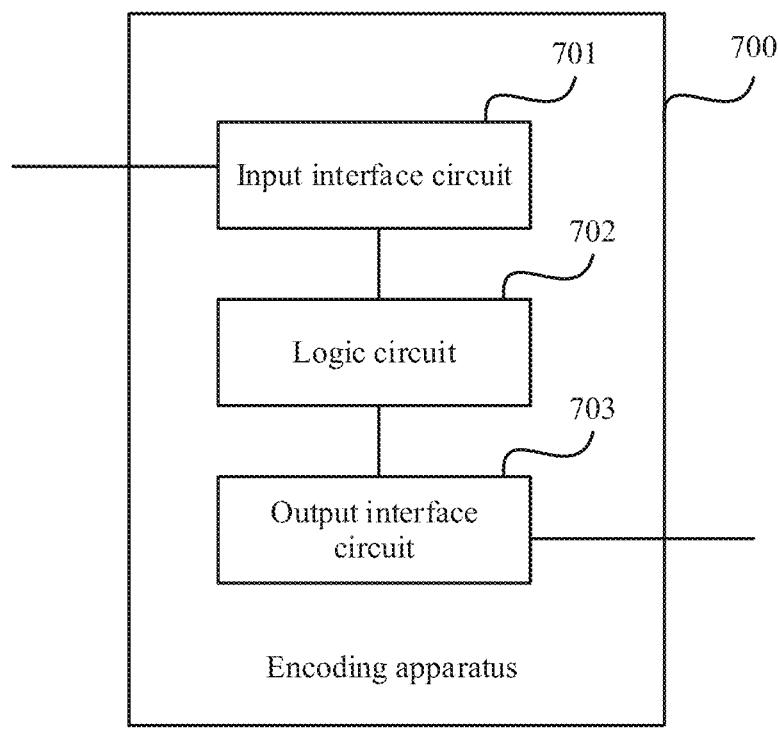
FIG. 7 is a schematic diagram of an encoding apparatus according to another embodiment of the application.

FIG. 7 is a schematic structural diagram of an encoding apparatus 700 for encoding according to another embodiment of the application. The apparatus 700 includes:

an input interface circuit 701, configured to obtain K to-be-encoded information bits, where K is an integer greater than or equal to 1;

a logic circuit 702, configured to generate a bit sequence $X_1^N$ where $X_1^N = D_1^N F_N$, $F_N$ is an N×N matrix, $F_N = F_2^{\otimes(log_2(N))}$, $F_N$ is a Kronecker product of $log_2 N$ matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of the K to-be-encoded information bits in an encoding diagram that has a mother code length of N, and $u_1^N$ is N bit sequences generated based on the K to-be-encoded information bits; K is an integer greater than or equal to 1, N is an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq log_m N-1$; and an output interface circuit 704, configured to output the encoded bit sequence $X_1^N$.

In an embodiment of the foregoing encoding process, the output bit sequence $D_1^N$ is designed based on the locations of the K to-be-encoded information bits in the encoding diagram, and in particular, the layer location index set M of the information bits in the encoding diagram; polar encoding of a polar code is performed on $D_1^N$; the encoded bit sequence is output. Compared with an existing non-system polar code, for the locations of the information bits in the encoding diagram, not only rows in which the information bits are located in the encoding diagram are considered, but also layer locations of the information bits in the encoding diagram need to be considered. The foregoing designed locations of the information bits are applied to an encoding process, so that a bit error rate (BER) of a system is greatly reduced. Further, in a decoding process of the encoding method, whether a decoding algorithm is stopped in advance is determined based on cyclic redundancy check, so that FAR performance in decoding is greatly reduced.

In an embodiment, the logic circuit 702 is further configured to generate the bit sequence $u_1^N$, the bit sequence $u_1^N$ includes the K to-be-encoded information bits and N−K fixed bits, and the K to-be-encoded information bits are placed at locations, in the zeroth layer in the encoding diagram, corresponding to the row location index set H.

The logic circuit 702 provided in an embodiment is further configured to generate the bit sequence $D_1^N$, $D_1^N$ includes a bit that corresponds to a bit sequence $C_1^N$ and that is in the row location index set H in the encoding diagram and a fixed bit, and the bit sequence $C_1^N$ is a bit sequence obtained after polar encoding is performed on $u_1^N$ based on the encoding diagram.

Because the foregoing processes of generating $u_1^N$ and $D_1^N$ by the logic circuit 702 relate to the locations of the K to-be-encoded information bits in the encoding diagram, a process of determining the locations of the information bits in the encoding diagram is the same as the foregoing processes described in FIG. 3 to FIG. 6, and details are not described herein again.

Further, the logic circuit 702 determines the layer location index set M of the information bits in the encoding diagram in the following several manners, and examples are as follows:

Example 1: The layer location index set M of the K to-be-encoded information bits in the encoding diagram includes any one of the first layer to the $(log_m N-1)^{th}$ layer.

Example 2: The manner of determining the layer location index set M of the information bits in the encoding diagram may be: The layer location index set M is obtained based on the row location index set H.

In at least one embodiment, first, any layer L is selected from a layer location index set M', and is determined as a layer index corresponding to a row index h in which any information bit in the row location index H is located, where h∈H.

Then, h in the row location index set H is traversed, to determine the layer location index set M in which all the K to-be-encoded information bits are located.

Alternatively, the manner of determining the layer location index set M of the information bits in the encoding diagram may be:

Example 3: For an embodiment of the foregoing example 2:

For each h in the row location index set H of the information bits, a layer index L of each information bit is calculated by using the following formula, where the formula is a function related to h.

The foregoing function related to h may be: L=ceil($log_2$ (rem(h, $2^m$)+1)). L is obtained through calculating, and m is an integer and is generally any value of 2, 3, or 4. h is a layer index corresponding to a row index h, in which any information bit is located, in the row location index H. The rem function is a function for calculating a remainder of dividing h by $2^m$, for example, rem(5, 2)=1, and the ceil function is a function for calculating a smallest integer greater than a number in brackets, for example, ceil(2.5)=3. The layer index L of the information bit of each h may be obtained by using the foregoing formula.

For a specific process of determining, by the logic circuit 702, the locations of the to-be-sent information bits on subchannels, refer to descriptions in FIG. 4, FIG. 5, and the embodiments corresponding to FIG. 4 and FIG. 5. Details are not described herein again.

The following describes, with reference to the locations of the information bits in the encoding diagram, the process of encoding the information bits.

The determining, by the logic circuit 702 provided in an embodiment, the input bit sequence $u_1^N$ may be implemented as follows:

Operation 1: The logic circuit 702 places the K to-be-encoded information bits at locations, in the zeroth layer in the encoding diagram, corresponding to the row location index set H.

Operation 2: The logic circuit 702 sets values set at other locations in the zeroth layer to fixed bits.

Operation 3: The logic circuit 702 obtains the bit sequence u based on the to-be-encoded information bits and the fixed bits.

It should be noted that a sequence of operation 1 and operation 2 may be changed, and is not limited.

The foregoing determining process may be the foregoing operation: The K to-be-encoded information bits are placed at the locations, in the layer 0 in the encoding diagram, corresponding to H, to obtain the input bit sequence $u_1^N$.

Further, the obtaining, by the logic circuit 702 provided in an embodiment, the bit sequence $D_1^N$ may be implemented as follows:

First, polar encoding is performed on the input bit sequence $u_1^N$ by using the logic circuit 702, to obtain the bit sequence $C_1^N$.

As shown in FIG. 6(*a*), the logic circuit 702 sequentially performs an operation, for example, a butterfly operation, on the obtained bit sequence $u_1^N$ from left to right, until it is calculated that M is corresponding N bit values in a layer $\{L_2\}$, that is, the encoded sequence $C_1^N$ is output. Herein, $C_1^N$ may be conveniently understood as the N bit sequences of the layer 2.

It should be noted that the foregoing process of performing polar encoding on $u_1^N$ is a part of an existing polar code encoding process. Herein, preferably, the butterfly operation is performed, based on the locations of the K to-be-encoded information bits in the encoding diagram, on $u_1^N$ from the layer 0, until it is calculated that M is the layer $\{L_2\}$, and the bit sequence $C_1^N$ is output. M is a layer index location of the information bits in the foregoing encoding diagram. As shown in FIG. 6(*a*), if the bit sequence $u_1^N$ corresponding to the layer 0 is $\{0, 0, 0, 1, 0, 1, 0, 1\}$, the bit sequence $C_1^N$ that corresponds to the layer 2 and that is obtained by performing the butterfly operation on $u_1^N$ from the layer 0 to the layer 2 may be $\{1, 1, 0, 1, 0, 1, 1, 1\}$. The foregoing polar encoding process is a part of existing polar encoding. For a specific polar encoding process, refer to descriptions of polar encoding in the prior art or in a standard. Details are not described herein again.

Then, the logic circuit 702 obtains the bit sequence $D_1^N$ based on $C_1^N$.

In at least one embodiment, as shown in FIG. 6(*a*), the logic circuit 702 takes, from the bit sequence $C_1^N$ that corresponds to the layer 2 and that is obtained by performing the butterfly operation, values corresponding to the row location index set H that includes the information bit locations, that is, takes, from the layer 2, values corresponding to the row location index set $\{h_3, h_5, h_6, h_7\}$, and the values are placed at locations corresponding to the row index set H $\{h_3, h_5, h_6, h_7\}$, in the layer 0 in FIG. 6(*b*). For example, values (1, 0, 1, 0) corresponding to the row location index set H that includes the information bit locations are taken from $C_1^N$, and the (1, 0, 1, 0) are placed at the locations corresponding to $\{h_3, h_5, h_6, h_7\}$, in the layer 0 in FIG. 6(*b*).

Then, the logic circuit 702 sets bits corresponding to other locations in the layer 0 to fixed bits.

In at least one embodiment, as shown in FIG. 6(*b*), values corresponding to other locations $\{h_0, h_1, h_2, h_4\}$ in the layer 0 in FIG. 6(*b*) are set to predefined fixed values, for example, all-0 bits. In this case, the values corresponding to other locations $\{h_0, h_1, h_2, h_4\}$ in the layer 0 are (0, 0, 0, 0).

Finally, as shown in FIG. 6(*b*), the logic circuit 702 obtains the bit sequence $D_1^N$ based on the bits corresponding to H and the fixed bits.

In at least one embodiment, as shown in FIG. 6(*b*), a sequence of the bit sequence $D_1^N$ that is of the layer 0 and that is output by the logic circuit 702 is (0, 0, 0, 1, 0, 0, 1, 0).

Further, the logic circuit 702 obtains the encoded bit sequence $X_1^N$ based on $D_1^N$ by using the formula $X_1^N = D_1^N F_N$.

An embodiment of the present disclosure further provides another implementation. For example, the foregoing logic circuit 702 may further obtain the bit sequence $X_1^N$ by using the formula below. The following uses FIG. 6 as an example to describe FIG. 6(*a*) and FIG. 6(*b*).

Operation 1: The logic circuit 702 obtains an input bit sequence $u_1^N$, where $u_1^N$ is a binary row vector and has a length of N.

For details, refer to the foregoing specific descriptions. Details are not described herein again.

Operation 2: The logic circuit 702 obtains $C_1^N$ based on $u_1^N$ by using a formula $$C_1^N = u_1^N \left( F_2^{\otimes M} \otimes \mathrm{diag}\left(\mathrm{ones}\left(\frac{N}{2^M}, 1\right)\right)\right).$$

Operation 3: The logic circuit 702 obtains a bit sequence $D_1^N$.

A specific encoding process is as follows:

For example, in FIG. 6(*a*), the obtained $C_1^N$ is $\{1, 1, 0, 0, 1, 1, 1, 0\}$, values $\{0, 1, 1, 0\}$ of a row location index set H $\{h_3, h_5, h_6, h_7\}$ are taken from $C_1^N$, and $\{0, 1, 1, 0\}$ are placed at bit locations corresponding to $\{h_3, h_5, h_6, h_7\}$ in the layer 0 in FIG. 6(*b*).

Further, a transmit end sets values of other bit locations, other than the row location index set H, of the zeroth layer to fixed bits. As shown in FIG. 6(*b*), the transmit end sets values of other locations, that is, bit locations corresponding to $\{h_0, h_1, h_2, h_4\}$, in the layer 0 to fixed bits, for example, $\{0, 0, 0, 0\}$.

After the foregoing encoding, the obtained $D_1^N$ is $\{0, 0, 0, 0, 0, 1, 1, 0\}$.

Operation 4: The logic circuit 702 outputs an encoded bit sequence $X_1^N$ based on $D_1^N$ by using a formula $X_1^N = D_1^N F_N$.

For example, in FIG. 6, the encoded bit sequence $\{0, 0, 0, 0, 0, 1, 1, 0\}$ of the layer 0 is $D_1^N$. After polar encoding is performed on each layer, an encoded bit sequence of the last layer, that is, the layer 3, is obtained. To be specific, the encoded bit sequence $X_1^N$ is obtained.

The addition and multiplication operations in the foregoing formulas are all addition and multiplication operations in a binary Galois field, and then the logic circuit 702 obtains the encoded bit sequence $X_1^N$.

For a method for determining, by the foregoing encoding apparatus, the locations of the information bits in the encoding diagram and for a channel encoding method, refer to FIG. 3 to FIG. 6, and the embodiments of the channel encoding method corresponding to FIG. 3 to FIG. 6. Details are not described herein again.

In an embodiment of the foregoing encoding process, the output bit sequence $D_1^N$ is designed based on the locations of the K to-be-encoded information bits in the encoding diagram, and in particular, the layer location index set M of the information bits in the encoding diagram; polar encoding of a polar code is performed on $D_1^N$; the encoded bit sequence $X_1^N$ is output. The encoding method not only reduces a BER on an encoding side, but also reduces a FAR in decoding. The channel encoding method is particularly effective when a decoding device performs decoding.

When a part or all of the channel encoding method in the foregoing embodiment is implemented by software, an embodiment of the present disclosure further provides an encoding apparatus 800. The apparatus includes a processor 802 in FIG. 8.

The processor 802 is configured to generate a bit sequence $X_1^N$, where $X_1^N = D_1^N F^N$, $F_N$ is an N×N matrix, $F_N = F_2^{\otimes(log_2(N))}$, $F_N$ is a Kronecker product of $log_2$ N matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of K to-be-encoded information bits in an encoding diagram that has a mother code length of N, and $u_1^N$ is N bit sequences generated based on the K to-be-encoded information bits; K is an integer greater than or equal to 1, N is an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \le H \le N$, and $0 < M \le log_m N-1$.

Further, optionally, the processor is further configured to generate the bit sequence $u_1^N$, $u_1^N$ includes the K to-be-encoded information bits and N-K fixed bits, and the K to-be-encoded information bits are placed at locations, in the zeroth layer in the encoding diagram, corresponding to the row location index set H.

The fixed bits are fixed values pre-agreed on by a receive end and a transmit end, and these pre-agreed fixed values may also be referred to as frozen bits.

An information bit is a bit used to carry information, and the information may include any one or a combination of the following: data information, signaling information, or check information, for example, power control information, uplink scheduling grant information, resource block resource allocation information, cyclic redundancy check CRC, parity check PC, or any other check information.

Further, optionally, the processor is further configured to generate the bit sequence $D_1^N$, $D_1^N$ includes a bit that corresponds to a bit sequence $C_1^N$ and that is in the row location index set H in the encoding diagram and a fixed bit, and the bit sequence $C_1^N$ is a bit sequence obtained after polar encoding is performed on $u_1^N$ based on the encoding diagram.

Further, optionally, the layer location index set M includes any one of the first layer to the $(log_m N-1)^{th}$ layer.

Alternatively, the layer location index set M is determined based on the row location index set H.

For a method for determining, by the foregoing encoding apparatus, the locations of the information bits in the encoding diagram and for a channel encoding method, refer to FIG. 3 to FIG. 6, and the embodiments of the channel encoding method corresponding to FIG. 3 to FIG. 6. Details are not described herein again.

The processor provided above designs the output bit sequence $D_1^N$ based on the locations of the K to-be-encoded information bits in the encoding diagram, and in particular, the layer location index set M of the information bits in the encoding diagram, performs polar encoding of a polar code on $D_1^N$, and outputs the encoded bit sequence $X_1^N$. The encoding method not only improves BER performance of an encoding device, but also improves FAR performance in decoding. The channel encoding method is particularly effective when a decoding device performs decoding.

Figure 9:
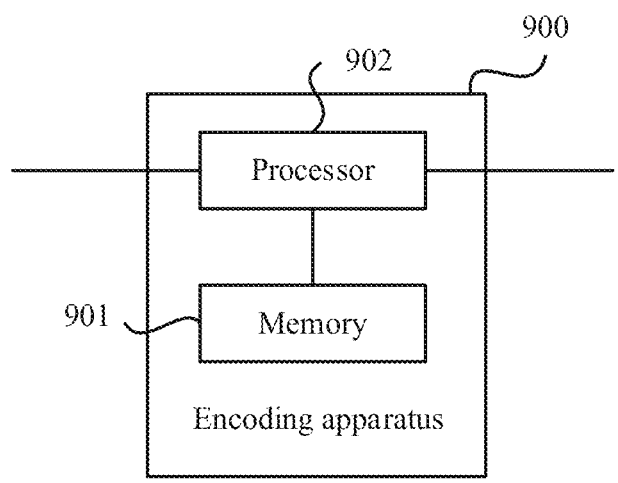
FIG. 9 is a schematic diagram of still another encoding apparatus according to an embodiment of the application.

An embodiment of the present disclosure may further provide an encoding apparatus 900, including a processor 902 and a memory 901. As shown in FIG. 9, the memory 901 is configured to store a program instruction.

The processor 902 is configured to: execute the program stored in the memory, and generate a bit sequence $X_1^N$ when the program is executed, where $X_1^N = D_1^N F_N$, $F_N$ is an N×N matrix, $F_N = F_2^{\otimes(log_2(N))}$, $F_N$ is a Kronecker product of $log_2$ N matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of K to-be-encoded information bits in an encoding diagram that has a mother code length of N, and $u_1^N$ is N bit sequences generated based on the K to-be-encoded information bits; K is an integer greater than or equal to 1, N is an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \le H \le N$, and $0 < M \le log_m N-1$.

The memory 901 may be a physically independent unit, or may be integrated with the processor 902.

In the foregoing embodiment, the memory may be located outside the encoding apparatus, and the encoding apparatus is connected to the memory by using a circuit/wire, and is configured to read and execute the program stored in the memory.

Figure 10:
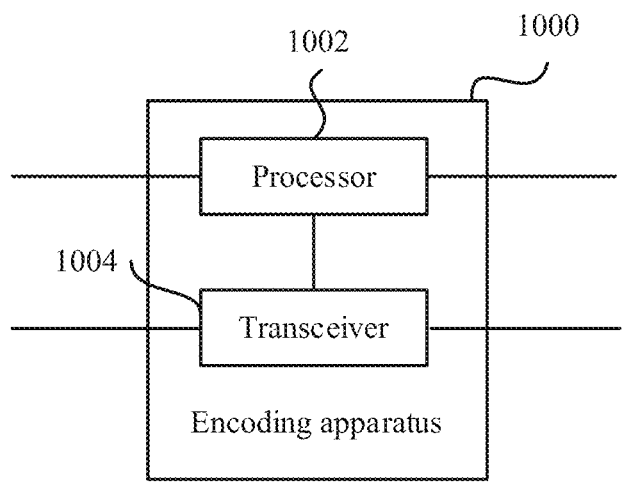
FIG. 10 is a schematic diagram of another encoding apparatus according to an embodiment of the application.

An embodiment of the present disclosure may further provide an encoding apparatus 1000, which may include: a processor 1002 and a transceiver 1004, as shown in FIG. 10.

The transceiver 1004 is configured to receive K to-be-encoded information bits and send $X_1^N$, where K is an integer greater than or equal to 1.

The processor 1002 is configured to generate the bit sequence $X_1^N$, where $X_1^N = D_1^N F_N$, $F_N$ is an N×N matrix, $F_N = F_2^{\otimes(log_2(N))}$, $F_N$ is a Kronecker product of $log_2$ N matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of the K to-be-encoded information bits in an encoding diagram that has a mother code length of N, and $u_1^N$ is N bit sequences generated based on the K to-be-encoded information bits; K is an integer greater than or equal to 1, N is an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, 0≤H≤N, and 0<M≤log$_m$ N−1.

For a method for determining, by the foregoing encoding apparatus, the locations of the information bits in the encoding diagram and for a channel encoding method, refer to FIG. 3 to FIG. 6, and the embodiments of the channel encoding method corresponding to FIG. 3 to FIG. 6. Details are not described herein again.

Further, the foregoing various encoding apparatuses may be base stations or terminals.

The encoding apparatus provided above designs the output bit sequence $D_1^N$ based on the locations of the K to-be-encoded information bits in the encoding diagram, and in particular, the layer location index set M of the information bits in the encoding diagram, performs polar encoding of a polar code on $D_1^N$, and outputs the encoded bit sequence $X_1^N$. The encoding method not only improves BER performance of an encoding device, but also improves FAR performance in decoding. The channel encoding method is particularly effective when a decoding device performs decoding.

Figure 11:
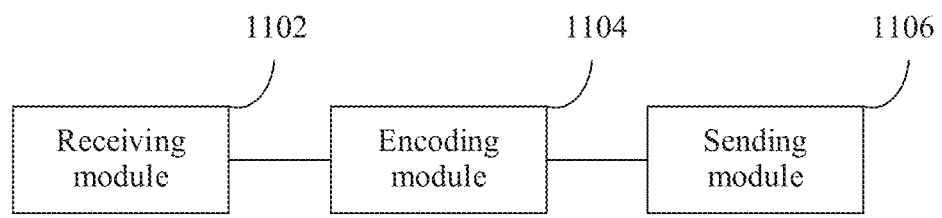
FIG. 11 is a schematic diagram of another encoding apparatus according to an embodiment of the application.

Another embodiment of the present disclosure further provides an encoding apparatus 1100. As shown in FIG. 11, the encoding apparatus 1100 includes:

a receiving module 1102, configured to obtain K to-be-encoded information bits, where K is an integer greater than or equal to 1;

an encoding module 1104, configured to generate a bit sequence $X_1^N$, where $X_1^N = D_1^N F_N$, $F_N$ is an N×N matrix, $F_N = F_2^{\otimes(\log_2(N))}$, $F_N$ is a Kronecker product of $\log_2$ N matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of the K to-be-encoded information bits in an encoding diagram that has a mother code length of N, and $u_1^N$ is N bit sequences generated based on the K to-be-encoded information bits; K is an integer greater than or equal to 1, N is an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, 0≤H≤N, and 0<M≤log$_m$ N−1; and a sending module 1106, configured to send the bit sequence $X_1^N$.

Further, the encoding module is further configured to generate the bit sequence $u_1^N$, $u_1^N$ includes the K to-be-encoded information bits and N−K fixed bits, and the K to-be-encoded information bits are placed at locations, in the zeroth layer in the encoding diagram, corresponding to the row location index set H.

Further, the encoding module is further configured to generate the bit sequence $D_1^N$, $D_1^N$ includes a bit that corresponds to a bit sequence $C_1^N$ and that is in the row location index set H in the encoding diagram and a fixed bit, and the bit sequence $C_1^N$ is a bit sequence obtained after polar encoding is performed on $u_1^N$ based on the encoding diagram.

The layer location index set M includes any one of the first layer to the $(\log_m N−1)^{th}$ layer, or the layer location index set M is obtained based on the row location index set H.

For a method for determining, by the foregoing encoding apparatus, the locations of the information bits in the encoding diagram and for a channel encoding method, refer to FIG. 3 to FIG. 6, and the embodiments of the channel encoding method corresponding to FIG. 3 to FIG. 6. Details are not described herein again.

Further, the foregoing various encoding apparatuses may be base stations or terminals.

The encoding apparatus provided above designs the output bit sequence $D_1^N$ based on the locations of the K to-be-encoded information bits in the encoding diagram, and in particular, the layer location index set M of the information bits in the encoding diagram, performs polar encoding of a polar code on $D_1^N$, and outputs the encoded bit sequence $X_1^N$. The encoding method not only improves BER performance of an encoding device, but also improves FAR performance in decoding. The channel encoding method is particularly effective when a decoding device performs decoding.

Another embodiment of the present disclosure further provides a readable storage medium, including a readable storage medium and a computer program. The computer program is used to implement the channel encoding method corresponding to any one of FIG. 3 to FIG. 6.

Another embodiment of the present disclosure further provides a program product. The program product includes a computer program, and the computer program is stored in a readable storage medium. At least one processor of an encoding apparatus may read the computer program from the readable storage medium, and the at least one processor executes the computer program, so that the encoding apparatus implements the channel encoding method according to any one of the channel encoding method embodiments corresponding to FIG. 3 to FIG. 6.

It should be noted that a transmit end performs decoding based on a received encoded sequence, where a decoding algorithm is similar to the decoding algorithm in the foregoing solution, and is the prior art. Details are not described herein. In the foregoing encoding method, an error correction capability of a decoding side is greatly improved.

An embodiment of the present disclosure further provides an encoding and decoding system. As shown in FIG. 1, the system includes a network device and a terminal device. The network device includes the encoding apparatus in each of the foregoing embodiments, or the terminal device includes the encoding apparatus in each of the foregoing embodiments. For specific functions implemented by the encoding apparatus, refer to the descriptions of FIG. 3 to FIG. 6 and corresponding embodiments.

Figure 12:
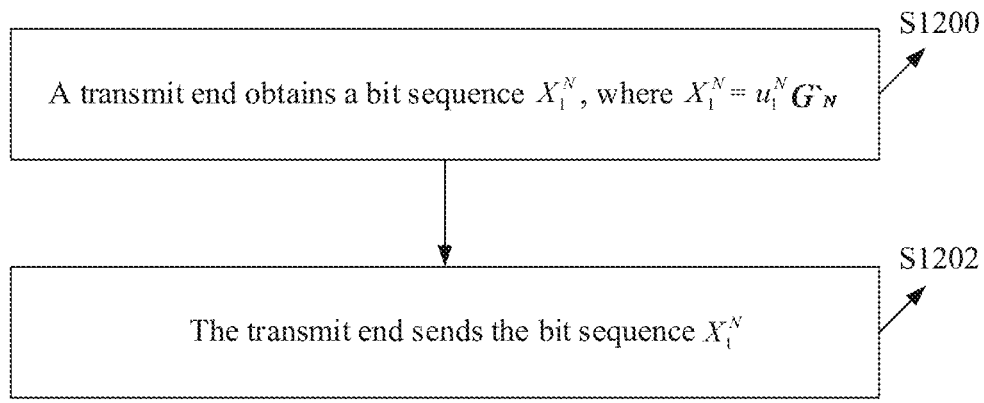
FIG. 12 is a flowchart of an embodiment of another channel encoding method according to another embodiment of the application.

An embodiment of the present disclosure further provides a flowchart of an embodiment of a channel encoding method. As shown in FIG. 12, an executive body of an embodiment is a transmit end, and the channel encoding method in an embodiment may include the following operations.

S1200. The transmit end obtains a bit sequence $X_1^N$, where $X_1^N = u_1^N G'_N$, $u_1^N$ is a bit sequence obtained based on K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2$ N matrices $F_2$ and $$F = \begin{bmatrix} 10 \\ 11 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_m N-1$.

S1202. The transmit end sends the bit sequence $X_1^N$.

An information bit is a bit used to carry information, and the information may include any one or a combination of the following: data information, signaling information, or check information, for example, power control information, uplink scheduling grant information, resource block resource allocation information, cyclic redundancy check (CRC), parity check (PC), or any other check information.

Fixed bits are values pre-agreed on by a receive end and the transmit end. These pre-agreed values may also be referred to as frozen bits, and may be 0.

The K to-be-encoded information bits may include a check bit, for example, a CRC bit, a parity check (PC) encoding bit, or any other check bit.

In at least one embodiment, the process in which the transmit end obtains the bit sequence $X_1^N$ is as follows:

First, the process in which the transmit end obtains the new matrix $G'_N$ is as follows:

The new matrix $G'_N$ is a matrix generated, based on the encoding generator matrix of the polar code and the locations of the K to-be-encoded information bits in the encoding diagram that has a mother code length of N.

For example, the transmit end may generate $G'_N$ by using the following formula:

New matrix $G'_N = \{BC+BC_{\tilde{H}}\}_H$

For the new matrix $G'_N = BC+BC_{\tilde{H}}$, $$B = F_2^{\otimes M} \otimes \text{diag}\left(\text{ones}\left(\frac{N}{2^M}, 1\right)\right),$$

$C = F_2^{\otimes n}$, and $n = \log_2 N$.

It can be learned from the foregoing descriptions that the foregoing new matrix $G'_N$ is a matrix generated by the transmit end based on the encoding generator matrix C of the polar code and the matrix B. The matrix B is related to $F_2^{\otimes M}$ and $$\text{diag}\left(\text{ones}\left(\frac{N}{2^M}, 1\right)\right),$$

C is a Kronecker Kronecker product of $\log_2 N$ matrices $F_2$ and $$F_2 = \begin{bmatrix} 10 \\ 11 \end{bmatrix}.$$

$F_2^{\otimes M}$ represents a Kronecker product of M matrices $F_2$, and a $2^M \times 2^M$ matrix is output, where M is a layer index set of subchannels on which the to-be-encoded information bits are located.

$$\text{diag}\left(\text{ones}\left(\frac{N}{2^M}, 1\right)\right)$$

is a function for generating a diagonal matrix, where $$\text{ones}\left(\frac{N}{2^M}, 1\right)$$

represents $$\frac{N}{2^M}$$

all-1 vectors. This function places input vectors, for example, all-1 vectors, on a diagonal line, and fills 0 for the rest, to output a $$\frac{N}{2^M} \times \frac{N}{2^M}$$

diagonal matrix.

The input bit sequence $u_1^N = (u_1, u_2, \ldots, u_N)$ is a binary row vector, it may be understood that the input bit sequence sets locations corresponding to the index set H to the to-be-encoded information bits, and sets other locations to 0, and $\tilde{H}$ represents a complementary set of H. When $A=BC+BC_{\tilde{H}}$, $A_h$ represents the $h^{th}$ row of the matrix A, L represents a column quantity of the matrix A, and $A_H$ is determined based on $$(A_H)_h = \begin{cases} \text{zeros}(1, L)(h \notin H) \\ A_h(h \in H) \end{cases};$$

If h belongs to the row index set H of the information bits, a value of h in the row location index set H is determined for assignment; if h does not belong to the row index set H of the information bits, L pre-agreed fixed values, for example, all-0 values, are determined. Herein, a value of a location corresponding to $A_H$ is determined by using the foregoing formula, and an N×N matrix is still output.

$(F_2^{\otimes n})_{\tilde{h}}$ represents the $h^{th}$ row of the matrix $F_2^{\otimes n}$, and $(F_2^{\otimes n})_{\tilde{H}}$ is determined by determining $$((F_2^{\otimes n})_{\tilde{H}})_h = \begin{cases} \text{zeros}(1, N)(h \notin \tilde{H}) \\ A_h(h \in \tilde{H}) \end{cases};$$

if h belongs to the complementary set $\tilde{H}$ of the row index set of the information bits, a value of h in the row location index set H is determined for assignment; if h does not belong to the complementary set $\tilde{H}$ of the row index set of the information bits, L pre-agreed fixed values, for example, all-0 values, are determined.

It should be noted that the foregoing formula is merely an example, and may be shown by using another formula. It may be understood that the foregoing new matrix $G'_N$ may be a matrix related to the encoding generator matrix of the polar code, or it may be understood that the foregoing new matrix $G'_N$ is a matrix related to locations, on subchannels, of the K to-be-encoded information bits. Alternatively, as described above, the new matrix $G'_N$ may be a matrix related to the encoding generator matrix of the polar code and the locations, on the subchannels, of the K to-be-encoded information bits.

Then, the transmit end obtains the input bit sequence $u_1^N$. $u_1^N$ includes the K to-be-encoded information bits and N−K fixed bits, and the K to-be-encoded information bits are placed at locations, in the zeroth layer in the encoding diagram, corresponding to the row location index set H.

In at least one embodiment, the transmit end places the K to-be-encoded information bits at locations, in the zeroth layer in the encoding diagram, corresponding to the row location index set H. Then the transmit end sets values of other (N−K) bit locations in the zeroth layer to fixed bits. Finally, the transmit end obtains the bit sequence $u_1^N$ based on the to-be-encoded information bits and the fixed bits.

Further, in a process of determining $u_1^N$, the transmit end further obtains the encoding diagram that has a mother code length of N, where the encoding diagram includes M' layers and H' rows. M' layers are equal to $(\log_m N+1)$ layers, which are the zeroth layer layer 0, the first layer layer 1, . . . , and the $(M'-1)^{th}$ layer layer $\log_m N$. H' rows are the zeroth row, . . . , and the $(N-1)^{th}$ row, where N is an integer power of m, and m is a positive integer greater than 1.

Further, the transmit end determines the locations of the K to-be-encoded information bits in the encoding diagram based on the foregoing encoding diagram. The locations of the K to-be-encoded information bits in the encoding diagram that has a mother code length of N include the row location index set H of the information bits in the encoding diagram and the layer location index set M of the information bits in the encoding diagram, where $H \subset H'$, $M \subset M'$, $0 \leq H \leq N$, and $0 \leq M \leq \log_m N-1$.

Because the locations of the information bits in the encoding diagram determine performance of channel encoding, in addition to determining the row location index set of the information bits in the encoding diagram, the determining the locations of the information bits in the encoding diagram further includes determining the layer location index set of the information bits in the encoding diagram. The following further describes, by using an example, a plurality of implementations of the process of determining the locations of the information bits in the encoding diagram.

In an embodiment, the process of determining the locations of the information bits in the encoding diagram is implemented in two operations: First, a row, of the encoding diagram, in which the information bits are placed is selected; second, a layer, of the selected row, in which the information bits are placed is further determined.

In at least one embodiment, the transmit end may determine, by using any one or a combination of the following one or more manners, the row location index set H in which the information bits are located: For example, the row location index set is determined based on a polarization weight (PW) sequence, a bar-type parameter, Gaussian approximation, or the like. Herein, the determining the row location index set H in which the information bits are located is the prior art, and details are not described herein again.

Using FIG. 4 as an example, based on the foregoing determining method, the row location index set H of the information bits in the encoding diagram is $\{h_3, h_5, h_6, h_7\}$. It may be understood that the four to-be-encoded information bits are separately located in the third row, the fifth row, the sixth row, and the seventh row of the encoding diagram in FIG. 4.

Further, the transmit end determines the layer location index set M of the information bits in the encoding diagram in the following several manners, and examples are as follows:

Example 1: The layer location index set M of the K to-be-encoded information bits in the encoding diagram includes any one of the first layer to the $(\log_m N-1)^{th}$ layer.

Example 2: The manner in which the transmit end determines the layer location index set M of the information bits in the encoding diagram may be: The layer location index set M is determined based on the row location index set H.

In at least one embodiment, first, the transmit end selects any layer L from the layer location index set M', and determines the layer L as a layer index corresponding to a row index h in which any information bit in the row location index H is located, where $h \in H$.

Then, the transmit end traverses h in the row location index set H, to determine the layer location index set M in which all the K to-be-encoded information bits are located.

Alternatively, the manner in which the transmit end determines the layer location index set M of the information bits in the encoding diagram may be:

Example 3: For an embodiment of the foregoing example 2:

For each h in the row location index set H of the information bits, the transmit end calculates a layer index L of each information bit by using the following formula, where the formula is a function related to h.

The foregoing function related to h may be: $L=\text{ceil}(\log_2(\text{rem}(h, 2^m)+1))$. L is obtained through calculating, and m is an integer and is generally any value of 2, 3, or 4. h is a layer index corresponding to a row index h, in which any information bit is located, in the row location index H. The rem function is a function for calculating a remainder of dividing h by $2^m$, for example, $\text{rem}(5, 2)=1$, and the ceil function is a function for calculating a smallest integer greater than a number in brackets, for example, $\text{ceil}(2.5)=3$. The layer index L of the information bit of each h may be obtained by using the foregoing formula.

In addition, for the foregoing manner, refer to the descriptions of the embodiments corresponding to FIG. 3 to FIG. 6. Details are not described herein again.

Finally, the transmit end performs matrix multiplication on the input bit sequence $u_1^N$ and the new matrix $G'_N$, and outputs an encoded 1×N bit sequence $x_1^N$, where $x_1^N=(u_1^N)\{BC+BC_{\bar{H}}\}_H$.

FIG. 6(a) and FIG. 6(b) are used as an example. The transmit end outputs, based on the input bit sequence $u_1^N$ and the new matrix $G'_N$, the N bits in the layer 3 in FIG. 6(b), that is, outputs the encoded 1×N bit sequence $x_1^N$.

Based on the foregoing channel encoding method, the transmit end obtains the encoded bit sequence $X_1^N$ based on $X_1^N = u_1^N G'_N$. Because the new matrix $G'_N$ is a matrix generated based on the encoding generator matrix of the polar code and the locations of K to-be-encoded information bits in the encoding diagram, an existing encoding matrix of the polar code is transformed, to obtain new channel encoding. Simulation results show that the channel encoding method not only greatly reduces a bit error rate (BER) of a system in encoding at a transmit end, but also reduces a FAR in decoding at a receive end after receiving.

An embodiment of the present disclosure further provides an encoding apparatus for encoding, configured to implement the channel encoding method in the foregoing embodiment. A part or all of the channel encoding method in the foregoing embodiment may be implemented by hardware or software. When the channel encoding method is implemented by hardware, refer to FIG. 7.

Another embodiment of the application further provides a schematic structural diagram of an encoding apparatus used for encoding. For a specific structure of the encoding apparatus, refer to FIG. 7. However, specific interface circuits implement different functions. The encoding apparatus herein includes:

an input interface circuit, configured to obtain K to-be-encoded information bits, where K is an integer greater than or equal to 1;

a logic circuit, configured to generate a bit sequence $X_1^N$, where $X_1^N = u_1^N G'_N$, $u_1^N$ is a bit sequence obtained based on the K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$, and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_m N - 1$; and an output interface circuit, configured to output the bit sequence $X_1^N$.

In an embodiment, the logic circuit is further configured to generate the new matrix $G'_N = BC + BC_{\bar{H}}$, where $$B = F_2^{\otimes M} \otimes \mathrm{diag}\left(\mathrm{ones}\left(\frac{N}{2^M}, 1\right)\right),$$

$C = F_2^{\otimes n}$, and $n = \log_2 N$.

In at least one embodiment, the process in which the logic circuit obtains the bit sequence $X_1^N$ is as follows:

First, the process in which the logic circuit obtains the new matrix $G'_N$ is as follows:

The new matrix $G'_N$ is a matrix generated, based on the encoding generator matrix of the polar code and the locations of the K to-be-encoded information bits in the encoding diagram that has a mother code length of N.

For example, a transmit end may generate $G'_N$ by using the following formula:

New matrix $G'_N = \{BC + BC_{\bar{H}}\}_H$

For the new matrix $G'_N = BC + BC_{\bar{H}}$, $$B = F_2^{\otimes M} \otimes \mathrm{diag}\left(\mathrm{ones}\left(\frac{N}{2^M}, 1\right)\right),$$

$C = F_2^{\otimes n}$, and $n = \log_2 N$.

It can be learned from the foregoing descriptions that the foregoing new matrix $G'_N$ is a matrix generated by the transmit end based on the encoding generator matrix C of the polar code and the matrix B. The matrix B is related to $F_2^{\otimes M}$ and $$\mathrm{diag}\left(\mathrm{ones}\left(\frac{N}{2^M}, 1\right)\right),$$

C is a Kronecker product of $\log_2 N$ matrices $F_2$ and $$F_2 = \begin{bmatrix} 1 & 0 \\ 1 & 1 \end{bmatrix}.$$

$F_2^{\otimes M}$ represents a Kronecker product of M matrices $F_2$, and a $2^M \times 2^M$ matrix is output, where M is a layer index set of subchannels on which the to-be-encoded information bits are located.

$$\mathrm{diag}\left(\mathrm{ones}\left(\frac{N}{2^M}, 1\right)\right)$$

is a function for generating a diagonal matrix, where $$\mathrm{ones}\left(\frac{N}{2^M}, 1\right)$$

represents $$\frac{N}{2^M}$$

all-1 vectors. This function places input vectors, for example, all-1 vectors, on a diagonal line, and fills 0 for the rest, to output a $$\frac{N}{2^M} \times \frac{N}{2^M}$$

diagonal matrix.

The input bit sequence $u_1^N = (u_1, u_2, \ldots, u_N)$ is a binary row vector, it may be understood that the input bit sequence sets locations corresponding to the index set H to the to-be-encoded information bits, and sets other locations to 0, and $\bar{H}$ represents a complementary set of H. When $A = BC + BC_{\bar{H}}$, $A_h$ represents the $h^{th}$ row of the matrix A, L represents a column quantity of the matrix A, and $A_H$ is determined based on $$(A_H)_h = \begin{cases} \mathrm{zeros}(1, L)(h \notin H) \\ A_h (h \in H) \end{cases}:$$

If h belongs to the row index set H of the information bits, a value of h in the row location index set H is determined for assignment; if h does not belong to the row index set H of the information bits, L pre-agreed fixed values, for example, all-0 values, are determined. Herein, a value of a location corresponding to $A_H$ is determined by using the foregoing formula, and an N×N matrix is still output.

$(F_2^{\otimes n})_{\tilde{h}}$ represents the $h^{th}$ row of the matrix $F_2^{\otimes n}$, and $(F_2^{\otimes n})_{\tilde{H}}$ is determined by determining $$((F_2^{\otimes n})_{\tilde{H}})_h = \begin{cases} \text{zeros}(1, N)(h \notin \tilde{H}) \\ A_h (h \in \tilde{H}) \end{cases};$$

if h belongs to the complementary set $\tilde{H}$ of the row index set of the information bits, a value of h in the row location index set H is determined for assignment; if h does not belong to the complementary set $\tilde{H}$ of the row index set of the information bits, L pre-agreed fixed values, for example, all-0 values, are determined.

It should be noted that the foregoing formula is merely an example, and may be shown by using another formula. It may be understood that the foregoing new matrix $G'_N$ may be a matrix related to the encoding generator matrix of the polar code, or it may be understood that the foregoing new matrix $G'_N$ is a matrix related to locations, on subchannels, of the K to-be-encoded information bits. Alternatively, as described above, the new matrix $G'_N$ may be a matrix related to the encoding generator matrix of the polar code and the locations, on the subchannels, of the K to-be-encoded information bits.

Then, the logic circuit obtains the input bit sequence $u_1^N$. $u_1^N$ includes the K to-be-encoded information bits and N−K fixed bits, and the K to-be-encoded information bits are placed at locations, in the zeroth layer in the encoding diagram, corresponding to the row location index set H.

In at least one embodiment, the logic circuit places the K to-be-encoded information bits at the locations, in the zeroth layer in the encoding diagram, corresponding to the row location index set H. Then the logic circuit sets values of other (N−K) bit locations in the zeroth layer to fixed bits. Finally, the logic circuit obtains the bit sequence $u_1^N$ based on the to-be-encoded information bits and the fixed bits.

Further, in a process of determining $u_1^N$, the logic circuit further obtains the encoding diagram that has a mother code length of N, where the encoding diagram includes M' layers and H' rows. M' layers are equal to $(\log_m N+1)$ layers, which are the zeroth layer layer 0, the first layer layer 1, . . . , and the $(M'-1)^{th}$ layer layer $\log_m N$. H' rows are the zeroth row, . . . , and the $(N-1)^{th}$ row, where N is an integer power of m, and m is a positive integer greater than 1.

Further, the logic circuit determines the locations of the K to-be-encoded information bits in the encoding diagram based on the foregoing encoding diagram. The locations of the K to-be-encoded information bits in the encoding diagram that has a mother code length of N include the row location index set H of the information bits in the encoding diagram and the layer location index set M of the information bits in the encoding diagram, where $H \subset H'$, $M \subset M'$, $0 \leq H \leq N$ and $0 \leq M \leq \log_m N-1$.

Because the locations of the information bits in the encoding diagram determine performance of channel encoding, in addition to determining the row location index set of the information bits in the encoding diagram, the determining the locations of the information bits in the encoding diagram further includes determining the layer location index set of the information bits in the encoding diagram. The following further describes, by using an example, a plurality of implementations of the process of determining the locations of the information bits in the encoding diagram.

In an embodiment, the process of determining the locations of the information bits in the encoding diagram is implemented in two operations: First, a row, of the encoding diagram, in which the information bits are placed is selected; second, a layer, of the selected row, in which the information bits are placed is further determined.

In at least one embodiment, the logic circuit may determine, by using any one or a combination of the following one or more manners, the row location index set H in which the information bits are located: For example, the row location index set is determined based on a polarization weight (PW) sequence, a bar-type parameter, Gaussian approximation, or the like. Herein, the determining the row location index set H in which the information bits are located is the prior art, and details are not described herein again.

Using FIG. 4 as an example, based on the foregoing determining method, the row location index set H of the information bits in the encoding diagram is $\{h_3, h_5, h_6, h_7\}$. It may be understood that the four to-be-encoded information bits are separately located in the third row, the fifth row, the sixth row, and the seventh row of the encoding diagram in FIG. 4.

Further, the logic circuit determines the layer location index set M of the information bits in the encoding diagram in the following several manners, and examples are as follows:

Example 1: The layer location index set M of the K to-be-encoded information bits in the encoding diagram includes any one of the first layer to the $(\log_m N-1)^{th}$ layer.

Example 2: The manner of determining, by the logic circuit, the layer location index set M of the information bits in the encoding diagram may be: The layer location index set M is determined based on the row location index set H.

In at least one embodiment, first, the logic circuit selects any layer L from a layer location index set M', and determines the layer L as a layer index corresponding to a row index h in which any information bit in the row location index H is located, where $h \in H$.

Then, the logic circuit traverses h in the row location index set H, to determine the layer location index set M in which all the K to-be-encoded information bits are located.

Alternatively, the manner of determining, by the logic circuit, the layer location index set M of the information bits in the encoding diagram may be:

Example 3: For an embodiment of the foregoing example 2:

For each h in the row location index set H of the information bits, the logic circuit calculates a layer index L of each information bit by using the following formula, where the formula is a function related to h.

The foregoing function related to h may be: $L=\text{ceil}(\log_2(\text{rem}(h, 2^m)+1))$. L is obtained through calculating, and m is an integer and is generally any value of 2, 3, or 4. h is a layer index corresponding to a row index h, in which any information bit is located, in the row location index H. The rem function is a function for calculating a remainder of dividing h by $2^m$, for example, $\text{rem}(5, 2)=1$, and the ceil function is a function for calculating a smallest integer greater than a number in brackets, for example, $\text{ceil}(2.5)=3$. The layer index L of the information bit of each h may be obtained by using the foregoing formula.

In addition, for the foregoing manner, refer to the descriptions of the embodiments corresponding to FIG. 12. Details are not described herein again.

Finally, the logic circuit performs matrix multiplication on the input bit sequence $u_1^N$ and the new matrix $G'_N$, and outputs an encoded 1×N bit sequence $x_1^N$, where $x_1^N = (u_1^N)\{BC + BC_{\bar{H}}\}_H$.

FIG. 6(a) and FIG. 6(b) are used as an example. The transmit end generates, based on the input bit sequence $u_1^N$ and the new matrix $G'_N$, the N bits in the layer 3 in FIG. 6(b), that is, generates the encoded 1×N bit sequence $x_1^N$.

Based on the foregoing encoding apparatus, the encoded bit sequence $X_1^N$ is obtained based on $X_1^N = u_1^N G'_N$. Because the new matrix $G'_N$ is a matrix generated based on the encoding generator matrix of the polar code and the locations of K to-be-encoded information bits in the encoding diagram, an existing encoding matrix of the polar code is transformed, to obtain new channel encoding. Simulation results show that the channel encoding method not only greatly reduces a bit error rate (BER) of a system in encoding at a transmit end, but also reduces a FAR in decoding at a receive end after receiving.

For a specific channel encoding process of the foregoing logic circuit, refer to FIG. 12 and the channel encoding method corresponding to FIG. 12. Details are not described herein again. In an embodiment, the encoding apparatus may be a chip or an integrated circuit.

Figure 8:
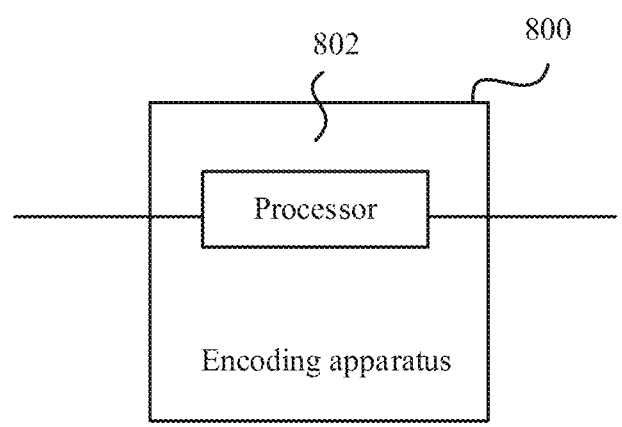
FIG. 8 is a schematic diagram of another encoding apparatus according to an embodiment of the application.

When a part or all of the channel encoding method in the foregoing embodiment is implemented by software, referring to FIG. 8, an embodiment of the present disclosure further provides an encoding apparatus. The apparatus includes:

a processor, configured to generate a bit sequence $X_1^N$, where $X_1^N = u_1^N G'_N$, $u_1^N$ is a bit sequence obtained based on K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$, and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_m N - 1$.

Further, the processor is further configured to generate the new matrix $G'_N = BC + BC_{\bar{H}}$, where $$B = F_2^{\otimes M} \otimes \text{diag}\left(\text{ones}\left(\frac{N}{2^M}, 1\right)\right),$$

$C = F_2^{\otimes n}$, and $n = \log_2 N$.

Further, the processor is further configured to generate the bit sequence $u_1^N$, $u_1^N$ includes the K to-be-encoded information bits and N−K fixed bits, and the K to-be-encoded information bits are placed at locations, in the zeroth layer in the encoding diagram, corresponding to the row location index set H.

Further, the layer location index set M includes any one of the first layer to the $(\log_m N - 1)^{th}$ layer.

Further, the layer location index set M is determined based on the row location index set H.

For a process in which the processor may further obtain the encoding diagram that has a length of N and determine the locations of the information bits in the encoding diagram, refer to the descriptions of the channel encoding method in FIG. 12. Details are not described herein again.

The channel encoding method of the encoding apparatus not only reduces a BER of the encoding device, but may further reduce a FAR of decoding. The channel encoding method is particularly effective when a decoding device performs decoding, and overall improves encoding and decoding performance.

An embodiment of the present disclosure further provides an encoding apparatus, including a processor and a memory. As shown in FIG. 9, the memory is configured to store a program instruction.

When the encoding apparatus includes the memory, the processor is configured to execute the program stored in the memory, and the processor generates a bit sequence $X_1^N$ when the program is executed, where $X_1^N = u_1^N G'_N$, $u_1^N$ is a bit sequence obtained based on K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$ and $$F = \begin{bmatrix} 1 & 0 \\ 1 & 1 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_m N - 1$.

Further, the processor is configured to generate the new matrix $G'_N = BC + BC_{\bar{H}}$, where $$B = F_2^{\otimes M} \otimes \text{diag}\left(\text{ones}\left(\frac{N}{2^M}, 1\right)\right),$$

$C = F_2^{\otimes n}$, and $n = \log_2 N$.

Further, the processor is further configured to generate $u_1^N$, which includes the K to-be-encoded information bits and N−K fixed bits, and the K to-be-encoded information bits are placed at locations, in the zeroth layer in the encoding diagram, corresponding to the row location index set H.

Further, the layer location index set M includes any one of the first layer to the $\log_m N - 1)^{th}$.

Further, the layer location index set M is determined based on the row location index set H.

The memory may be a physically independent unit, or may be integrated with the processor.

An embodiment of the present disclosure may further provide another optional embodiment. The foregoing memory is located outside the encoding apparatus, and the encoding apparatus is connected to the memory by using a circuit/wire, and is configured to read and execute the program stored in the memory.

The channel encoding method of the encoding apparatus not only reduces a BER of the encoding device, but may further reduce a FAR of decoding. The channel encoding method is particularly effective when a decoding device performs decoding, and overall improves encoding and decoding performance.

Another encoding apparatus further provided in an embodiment of the present disclosure may include a processor and a transceiver. As shown in FIG. 10, the transceiver is configured to receive K to-be-encoded information bits, and send a bit sequence $X_1^N$, where K is an integer greater than or equal to 1.

The processor is configured to generate the bit sequence $X_1^N$, where $X_1^N = u_1^N G'_N$, $u_1^N$ is a bit sequence obtained based on the K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$ and $$F = \begin{bmatrix} 10 \\ 11 \end{bmatrix};$$

K is an integer greater than or equal to 1, N is the length of a mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_m N - 1$.

Further, the processor is further configured to generate the new matrix $G'_N = BC + BC_{\bar{H}}$, where $$B = F_2^{\otimes M} \otimes \mathrm{diag}\left(\mathrm{ones}\left(\frac{N}{2^M}, 1\right)\right),$$

$C = F_2^{\otimes n}$, and $n = \log_2 N$.

Further, the processor is further configured to obtain the bit sequence $u_1^N$, $u_1^N$ includes the K to-be-encoded information bits and N−K fixed bits, and the K to-be-encoded information bits are placed at locations, in the zeroth layer in the encoding diagram, corresponding to the row location index set H.

Further, the layer location index set M includes any one of the first layer to the $(\log_m N-1)^{th}$.

Further, the layer location index set M is obtained based on the row location index set H.

For a specific encoding process of the foregoing encoding apparatus, refer to the foregoing channel encoding embodiment and the corresponding descriptions in FIG. 12. Details are not described herein again.

Further, the encoding apparatus is a base station or a terminal.

An embodiment of the present disclosure may further provide another optional embodiment. The foregoing memory is located outside the encoding apparatus, and the encoding apparatus is connected to the memory by using a circuit/wire, and is configured to read and execute the program stored in the memory.

The channel encoding method of the encoding apparatus not only reduces a BER of the encoding device, but may further reduce a FAR of decoding. The channel encoding method is particularly effective when a decoding device performs decoding, and overall improves encoding and decoding performance.

Another embodiment of the present disclosure further provides an encoding apparatus. As shown in FIG. 11, the encoding apparatus includes:

a receiving module, configured to obtain K to-be-encoded information bits, where K is an integer greater than or equal to 1;

an encoding module, configured to generate a bit sequence $X_1^N$, where $X_1^N = u_1^N G'_N$, $u_1^N$ is a bit sequence obtained based on the K to-be-encoded information bits, and the new matrix $G'_N$ is a matrix generated based on an encoding generator matrix of a polar code and locations of the K to-be-encoded information bits in an encoding diagram that has a mother code length of N; the encoding generator matrix of the polar code is a Kronecker product of $\log_2 N$ matrices $F_2$ and $$F = \begin{bmatrix} 10 \\ 11 \end{bmatrix};$$

K is an integer greater than or equal to 1, N is the length of the mother code and an integral power of m, and m is a positive integer greater than 1; and the locations of the K to-be-encoded information bits in the encoding diagram that has a mother code length of N include a row location index set H of the information bits in the encoding diagram and a layer location index set M of the information bits in the encoding diagram, $0 \leq H \leq N$, and $0 < M \leq \log_m N - 1$; and a sending module, configured to send the bit sequence $X_1^N$.

The encoding apparatus provided in the foregoing embodiment may be a base station or a terminal.

For a specific encoding process of the foregoing encoding apparatus, refer to the foregoing channel encoding embodiment and the corresponding descriptions in FIG. 12. Details are not described herein again.

The channel encoding method of the encoding apparatus not only reduces a BER of the encoding device, but also reduces a FAR of decoding. The channel encoding method is particularly effective when a decoding device performs decoding.

Another embodiment of the present disclosure further provides a readable storage medium, including:

a readable storage medium and a computer program, where the computer program is used to implement the channel encoding method according to any one of FIG. 12 and the method embodiments corresponding to FIG. 12.

Another embodiment of the present disclosure further provides a program product. The program product includes a computer program, the computer program is stored in a readable storage medium. At least one processor of an encoding apparatus may read the computer program from the readable storage medium, and the at least one processor executes the computer program, so that the encoding apparatus implements the channel encoding method according to any one of FIG. 12 and the method embodiments corresponding to FIG. 12.

It should be noted that a transmit end performs decoding based on a received encoded sequence, where a decoding algorithm is similar to the decoding algorithm in the foregoing solution, and is the prior art. Details are not described herein. In the foregoing encoding method, an error correction capability of a decoding side is greatly improved.

Another embodiment of the present disclosure further provides an encoding system. As shown in FIG. 1, the encoding system includes a network device and a terminal device. The network device includes the foregoing various encoding apparatuses; or the terminal device includes the foregoing various encoding apparatuses.

For specific apparatus structures of the encoding apparatus and functions implemented by the encoding apparatus, refer to specific descriptions in the foregoing embodiments. Details are not described herein again.

An embodiment of the present disclosure further provides a channel encoding method, which is as follows:

A to-be-encoded information bit sequence {1,1} is used as an example. The to-be-encoded information bit sequence is implemented by using another channel encoding method, and is represented in a form of a factor diagram. A color filling node represents an information bit, a dashed-line shadow filling node represents a frozen bit, and remaining white unfilled nodes represent variable nodes that need to be calculated in an encoding process.

Dashed lines in the factor diagram indicate that the variable node or check relationship is not used and is in an inactive state.

In the foregoing description process, X is used to represent an undefined value. X is only a representation method, and all undefined values may also be marked as 2. Generally, the undefined value is marked as 0.

Figures 1, 17:
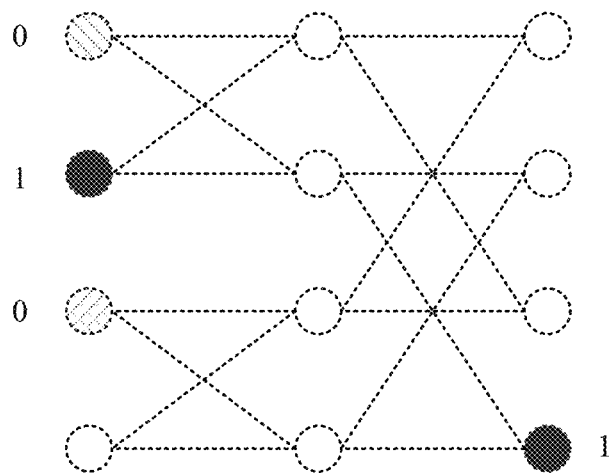
Figures 2, 17:
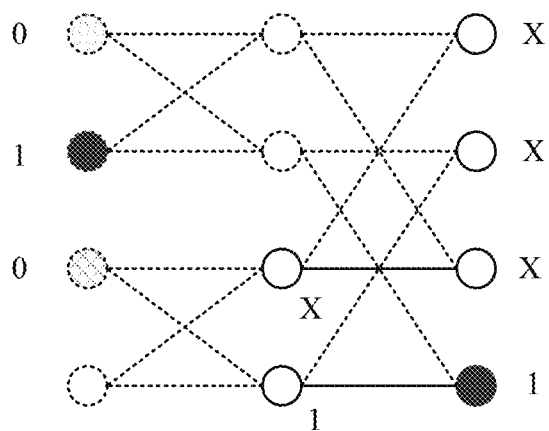
Figures 3, 17:
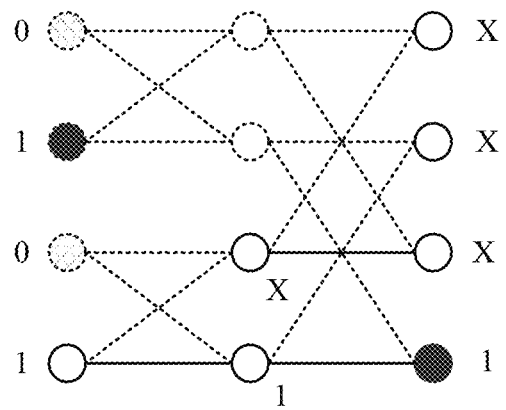
Figures 4, 17:
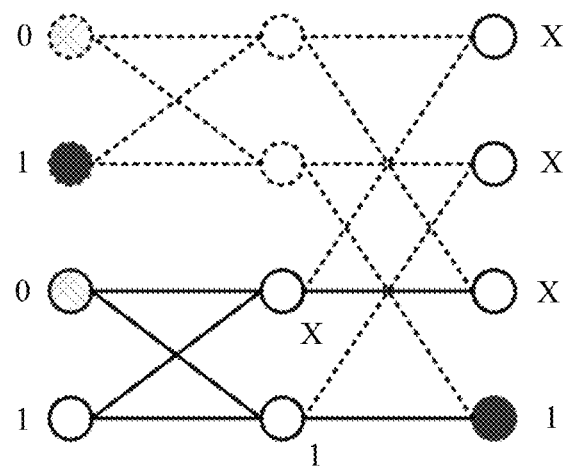
Figures 5, 17:
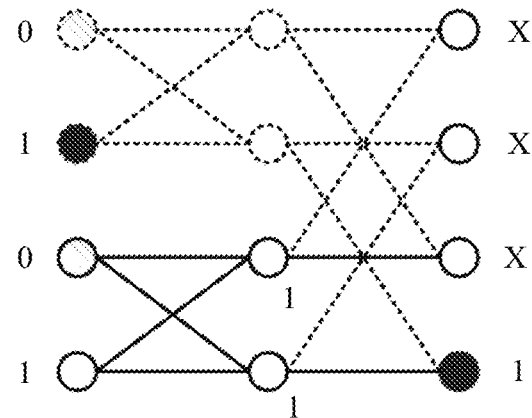
Figures 6, 17:
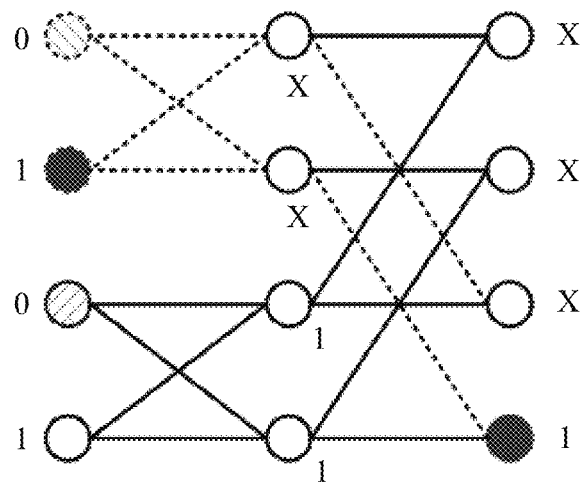
Figures 7, 17:
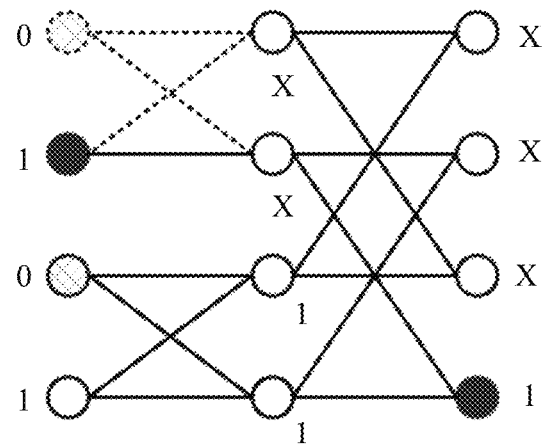
Figures 8, 17:
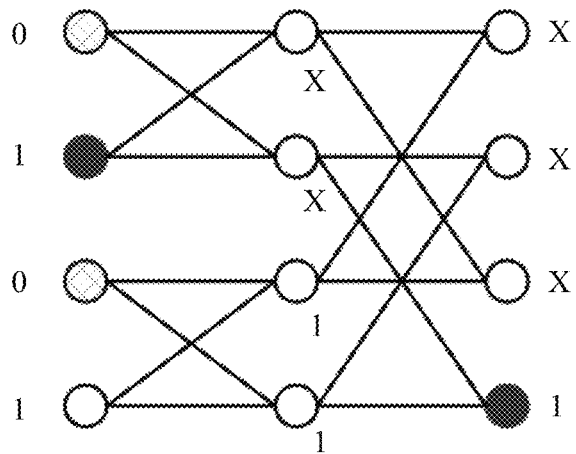
Figures 9, 17:
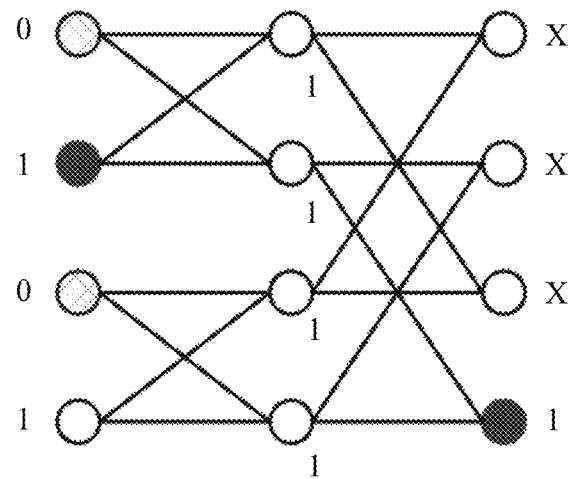
Figures 10, 17:
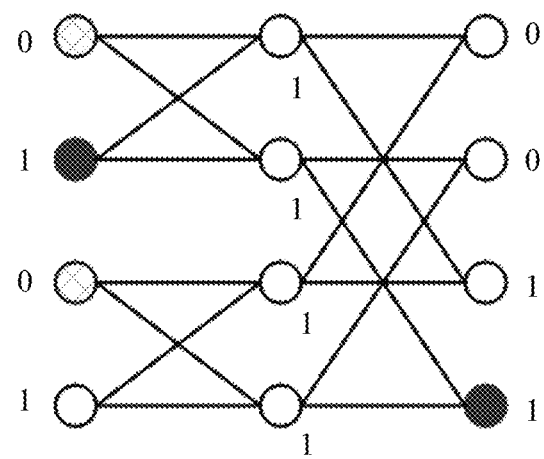

From the perspective of the factor diagram, values corresponding to all variable nodes in the rightmost column of the factor diagram are calculated, which corresponds to the completion of the encoding process. A specific encoding process is as follows:

Operation 1: As shown in the activity factor diagram FIG. 17-1, there are four variable nodes in the third column, where if information about a variable node is known, the variable node is set to a corresponding known value; otherwise, the variable node is set to X. A transmit end obtains a sequence {x, x, x, 1} based on the activity factor diagram 1, where the sequence is referred to as a bit sequence C1.

Operation 2: Connect two bits x and 1, corresponding to the last two variable nodes in the second column of the activity factor diagram 2, to the second half part of the sequence C1, which is referred to as a sequence C2.

Operation 3: As shown in the activity factor diagram 3, the second half part 1 of the sequence C2, corresponding to the last variable node in the first column in the activity factor diagram 3, is referred to as a sequence C3.

Operation 4: As shown in the activity factor diagram 4, an exclusive OR operation is performed on the first half of the sequence C3 and the first half of the sequence C2 to obtain a sequence X, which is referred to as a sequence C4, and The process corresponds to the third variable node in the first column of the activity factor diagram 4, where because the variable node is a frozen bit, the sequence C4 is set to 0.

Operation 5: As shown in the activity factor diagram 5, an exclusive OR operation is performed on the sequence C4 and the sequence C3 to obtain a sequence 1, which corresponds to the third variable node in the second column in the factor diagram 5, that is, the sequence C2 is updated to a sequence {1, 1}.

Operation 6: As shown in the activity factor diagram 6, an exclusive OR operation is performed on the sequence C2 and the first half of the sequence C1 to obtain a sequence {x, x}, which is referred to as a sequence C5 corresponding to the first two variable nodes in the second column in the activity factor diagram 6.

Operation 7: As shown in the activity factor diagram 7, the second half X of the sequence C5 corresponds to the second variable node in the first column in the activity factor diagram 7, where because the variable node corresponds to an information bit, the variable node is set to to-be-sent unencoded information 1, which is referred to as a sequence C6.

Operation 8: Perform an exclusive OR operation on the sequence C6 and the first half part of the sequence C5 to obtain a sequence X, which is referred to as a sequence C7, where The process corresponds to the first variable node in the first column in the activity factor diagram, and the C7 is set to 0 because the variable node is a frozen bit.

Operation 9: Set the second half of the C5 to the sequence C6, and set the first half of the C5 to the result of performing an exclusive OR operation on the sequence C6 and the sequence C7, that is, update the sequence C5 to {1, 1}.

Operation 10: Set the second half of the C1 to the sequence C2, and set the first half of the C1 to a result of performing an exclusive OR operation on the sequence C2 and the sequence C5, that is, update the sequence C1 to {0, 0, 1, 1}.

Operation 11: Output the encoded bit sequence {0, 0, 1, 1} by using the foregoing encoding scheme.

The foregoing channel encoding process is also an implementation. A part or all of the channel encoding method in the foregoing embodiment may be implemented by hardware or software. When a part or all of the channel encoding method in the foregoing embodiment is implemented by software, an encoding apparatus may also be provided for the foregoing encoding process. The apparatus may include a processor, and the processor completes the foregoing encoding process. When a part or all of the channel encoding method in the foregoing embodiment is implemented by hardware, an embodiment may also provide an encoding apparatus, where the apparatus includes: an input interface circuit, configured to receive K to-be-encoded information bits, where K is an integer greater than 1; a logic circuit, configured to complete the foregoing channel encoding method; and an output interface circuit, configured to output an encoded bit sequence. In an embodiment, the encoding apparatus may be a chip or an integrated circuit. An embodiment of the present disclosure further provides an encoding apparatus, including a processor and a memory. The memory is configured to store a program instruction, and the processor is configured to execute the program stored in the memory. When the program is executed, the processor is configured to perform the foregoing channel encoding method.

Further, the memory may be a physically independent unit, or may be integrated with the processor. In another optional embodiment, the memory is located outside the encoding apparatus, and the encoding apparatus is connected to the memory by using a circuit/wire, and is configured to read and execute the program stored in the memory.

Another encoding apparatus further provided in an embodiment of the present disclosure may include a processor and a transceiver. The transceiver is configured to receive K to-be-encoded information bits, and send an encoded bit sequence, where K is an integer greater than or equal to 1; and the processor is configured to perform the foregoing channel encoding method.

Another encoding apparatus further provided in an embodiment of the present disclosure may include a plurality of encoding units, and each encoding unit separately completes each encoding process of the foregoing channel encoding method.

Based on the descriptions of the foregoing embodiments, the encoding apparatus may be the network device or the terminal device (for example, the terminal device #1 or the terminal device #2) shown in FIG. 1. In at least one embodiment, in uplink transmission, the encoding apparatus is a terminal device, for example, user equipment UE. The terminal device has a function of implementing the channel encoding method described in the foregoing embodiments. In downlink transmission, the encoding apparatus is a network device, for example, a base station. The terminal device or the network device has a function of implementing the channel encoding method described in the foregoing embodiments. These functions may be implemented by hardware, or may be implemented by hardware executing corresponding software. The hardware or software includes one or more units corresponding to the foregoing functions.

In addition, optionally, in order to make functions of the encoding apparatus more complete, the encoding apparatus may further include one or more of an input unit, a display unit, an audio circuit, a camera, a sensor, and the like (not shown in the figure), and the audio circuit may further include a loudspeaker, a microphone, and the like.

Figure 13:
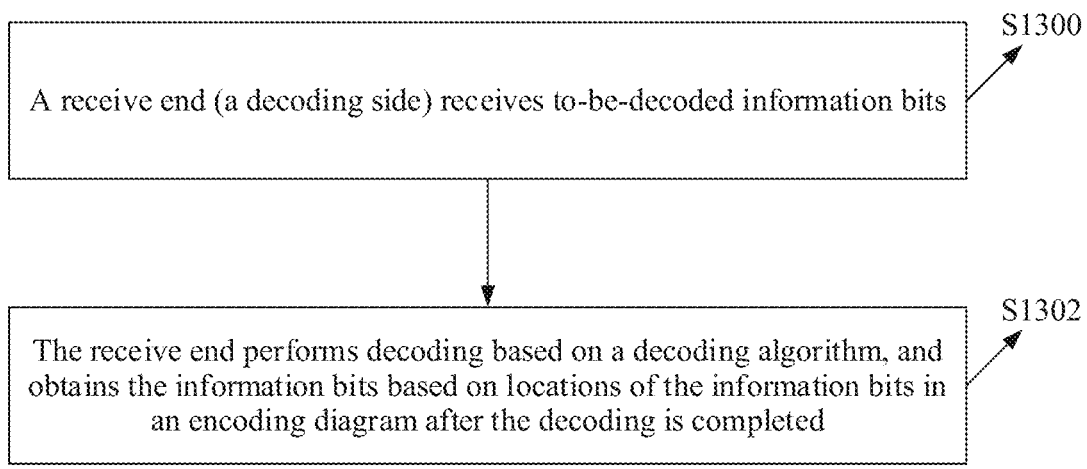
FIG. 13 is a flowchart of an embodiment of a channel decoding method according to another embodiment of the application.

Optionally, based on the channel encoding method provided in the foregoing embodiments, another embodiment of the present disclosure further provides a decoding method. As shown in FIG. 13, the method includes the following operations.

S1300. A receive end (a decoding side) receives to-be-decoded information bits.

S1302. The receive end performs decoding based on a decoding algorithm, and obtains the information bits based on locations of the information bits in an encoding diagram after the decoding is completed.

The decoding algorithm may be a successive cancellation decoding algorithm or a successive cancellation list decoding algorithm.

In an embodiment, a decoding operation at the decoding side is roughly as follows: After the to-be-decoded information bits are received, decoding is performed based on the decoding algorithm; after the decoding is completed, the information bits are obtained based on the locations of the information bits in the encoding diagram.

For a method for determining the locations of the foregoing information bits in the encoding diagram and descriptions of the encoding diagram, refer to descriptions of the embodiments corresponding to FIG. 3 to FIG. 6. Details are not described herein again.

Figure 14:
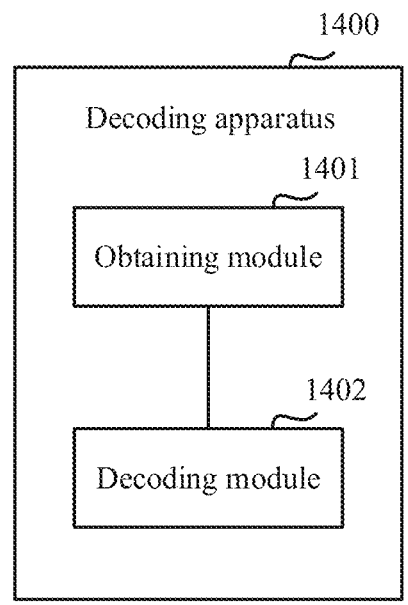
FIG. 14 is a schematic diagram of another decoding apparatus according to an embodiment of the application.
Figure 15:
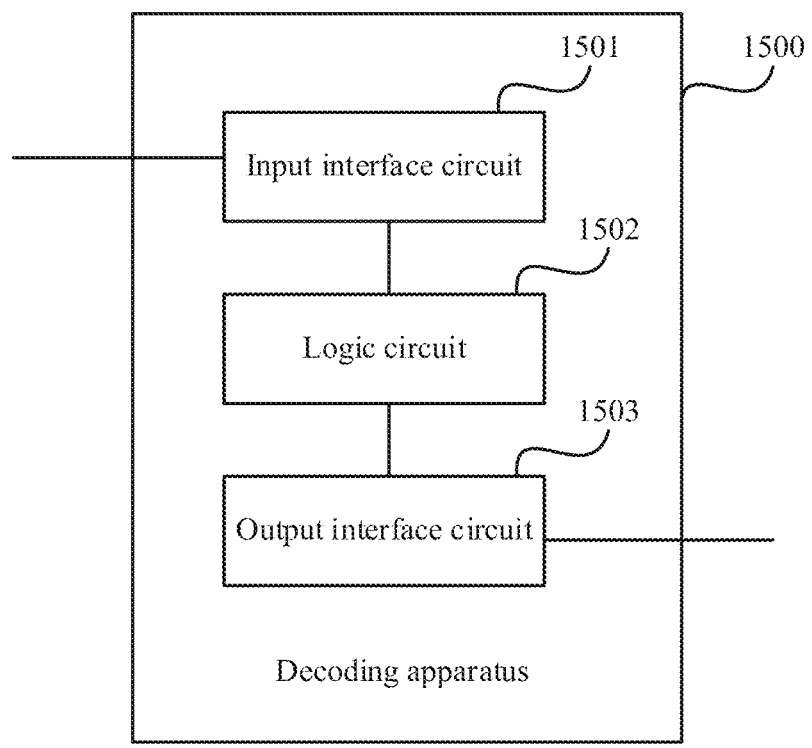
FIG. 15 is a schematic diagram of another decoding apparatus according to an embodiment of the application.

Further, based on a same inventive concept of the decoding method provided in the foregoing embodiment, as shown in FIG. 14, an embodiment of the application further provides a decoding apparatus 1400. The decoding apparatus 1400 is configured to perform the foregoing decoding method. In at least one embodiment, the decoding apparatus includes: an obtaining module 1401, configured to obtain a bit sequence of to-be-decoded information; and a decoding module 1402, configured to perform decoding according to a decoding algorithm, and obtain information bits based on locations of the information bits in an encoding diagram after the decoding is completed.

A part or all of the foregoing decoding method may be implemented by hardware, or may be implemented by software. When the decoding method is implemented by hardware, a decoding apparatus 1500 includes: an input interface circuit 1501, configured to obtain a to-be-decoded bit sequence; a logic circuit 1502, configured to perform the decoding method; and an output interface circuit 1503, configured to output a decoded sequence.

Optionally, in an embodiment, the decoding apparatus 1500 may be a chip or an integrated circuit.

Figure 16:
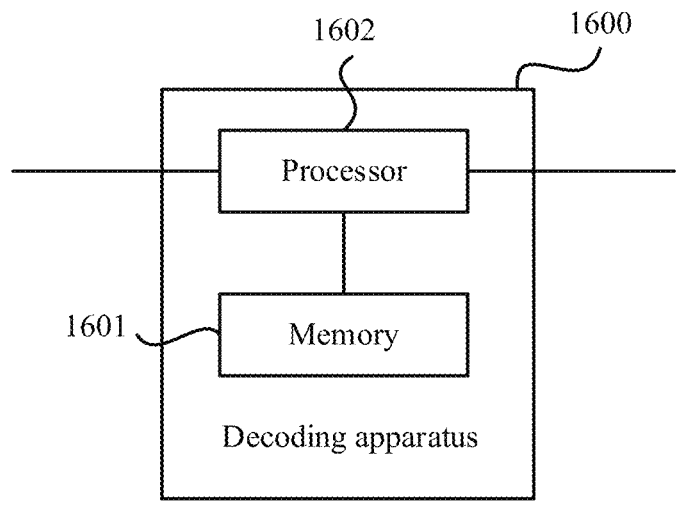
FIG. 16 is a schematic diagram of another decoding apparatus according to an embodiment of the application.

Optionally, when a part or all of the decoding method in the foregoing embodiment is implemented by using software, as shown in FIG. 16, a decoding apparatus 1600 includes: a memory 1601, configured to store a program; and a processor 1602, configured to execute the program stored in the memory 1601. When the program is executed, the decoding apparatus 1600 can implement the decoding method provided in the foregoing embodiment.

Optionally, the memory 1601 may be a physically independent unit, or may be integrated with the processor 1602.

Optionally, when a part or all of the decoding method in the foregoing embodiment is implemented by using software, the decoding apparatus 1600 may alternatively include only the processor 1602. The memory 1601 configured to store a program is located outside the decoding apparatus 1600. The processor 1602 is connected to the memory 1601 by using a circuit/wire, and is configured to read and execute the program stored in the memory 1601.

The processor 1602 may be a central processing unit (CPU), a network processor (network processor, NP), or a combination of a CPU and an NP.

The processor 1602 may further include a hardware chip. The hardware chip may be an application-specific integrated circuit (ASIC), a programmable logic device (PLD), or a combination thereof. The PLD may be a complex programmable logic device (CPLD), a field programmable gate array (FPGA), a generic array logic (GAL), or any combination thereof.

The memory 1601 may include a volatile memory (volatile memory), for example, a random-access memory (RAM). The memory 1601 may also include a non-volatile memory, for example, a flash memory, a hard disk drive (HDD), or a solid-state drive (SSD). The memory 1601 may further include a combination of the foregoing types of memories.

An embodiment of the application further provides a computer storage medium, and the computer storage medium stores a computer program. The computer program is used to perform the encoding method shown in FIG. 3 and the decoding method provided in the foregoing embodiment in FIG. 13.

An embodiment of the application further provides a computer program product including an instruction. When the computer program product is run on a computer, the computer performs the decoding method shown in FIG. 13.

One of ordinary skill in the art should understand that the embodiments of the application may be provided as a method, a system, or a computer program product. Therefore, the application may use a form of hardware only embodiments, software only embodiments, or embodiments with a combination of software and hardware. Moreover, the application may use a form of a computer program product that is implemented on one or more computer-usable storage media (including but not limited to a disk memory, a CD-ROM, an optical memory, and the like) that include computer usable program code.

The application is described with reference to the flowcharts and/or block diagrams of the method, the device (system), and the computer program product according to the embodiments of the application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations are performed on the computer or the another programmable device, thereby generating computer-implemented processing. Therefore, the instructions executed on the computer or the another programmable device provide operations for implementing a specific function in one or more processes in the flowcharts and/or in one or more blocks in the block diagrams.

Although some preferred embodiments of the application have been described, one of ordinary skill in the art can make changes and modifications to these embodiments once they learn the basic inventive concept. Therefore, the following claims are intended to be construed as to cover the preferred embodiments and all changes and modifications falling within the scope of the application.

Obviously, one of ordinary skill in the art can make various modifications and variations to the embodiments of the application without departing from the spirit and scope of the embodiments of the application. The application is intended to cover these modifications and variations provided that they fall within the scope of protection defined by the following claims and their equivalent technologies.

What is claimed is:

1. A channel encoding method, comprising:
obtaining, by a processor, a bit sequence $X_1^N$, wherein $X_1^N=D_1^N F_N$, $F_N$ is an N×N matrix, $F_N=F_2^{\otimes(log_2(N))}$, $F_N$ is a Kronecker product of a plurality ($log_2 N$) of matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of K to-be-encoded information bits in an encoding diagram that has a mother code length of N, and $u_1^N$ is an N bit sequence generated based on the K to-be-encoded information bits; wherein K is an integer greater than or equal to 1, N is an integral power of m, and m is a positive integer greater than 1; and wherein the locations of the K to-be-encoded information bits comprise a row location index set H indicating one or more rows in the encoding diagram to place the to-be-encoded information bits and a layer location index set M indicating one or more layers in the encoding diagram to place the to-be-encoded information bits, wherein 0≤H≤N, and 0<M≤$log_m$ N−1, and wherein the layer location index set M is determined by the processor to decrease a bit error rate in encoding of the to-be-encoded information bits and a false alarm rate in decoding of the encoded information bits in a data communication system; and
sending, by the processor, the bit sequence $X_1^N$ to a receive end in the data communication system.

2. The channel encoding method according to claim 1, wherein the bit sequence $u_1^N$ comprises the K to-be-encoded information bits and N−K fixed bits, and the K to-be-encoded information bits are placed at the locations, in a zeroth layer in the encoding diagram, corresponding to the row location index set H.

3. The channel encoding method according to claim 1, wherein $D_1^N$ comprises a bit that corresponds to a bit sequence $C_1^N$ and that is in the row location index set H in the encoding diagram and a fixed bit, and wherein the bit sequence $C_1^N$ is a bit sequence obtained after polar encoding is performed on $u_1^N$ based on the encoding diagram.

4. The channel encoding method according to claim 3, wherein the layer location index set M comprises any one of a first layer to a $(log_m N-1)^{th}$ layer.

5. The channel encoding method according to claim 3, wherein the layer location index set M is determined based on the row location index set H.

6. An encoding apparatus, comprising:
an input interface circuit configured to obtain K to-be-encoded information bits, wherein K is an integer greater than or equal to 1;
a logic circuit configured to generate a bit sequence $X_1^N$, wherein $X_1^N=D_1^N F_N$, $F_N$ is an N×N matrix, $F_N=F_2^{\otimes(log_2(N))}$, $F_N$ is a Kronecker product of a plurality ($log_2 N$) of matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of the K to-be-encoded information bits in an encoding diagram that has a mother code length of N, M' layers and H' rows, and $u_1^N$ is an N bit sequence generated based on the K to-be-encoded information bits; wherein K is an integer greater than or equal to 1, N is an integral power of m, and m is a positive integer greater than 1; and wherein the locations of the K to-be-encoded information bits comprise a row location index set H indicating one or more rows in the encoding diagram to place the to-be-encoded information bits in the encoding diagram and a layer location index set M indicating one or more layers in the encoding diagram to place the to-be-encoded information bits, wherein 0≤H≤N, and 0<M≤$log_m$ N−1, and wherein the layer location index set M is determined to decrease a bit error rate in encoding of the to-be-encoded information bits and a false alarm rate in decoding of the encoded information bits in a data communication system; and
an output interface circuit configured to output the bit sequence $X_1^N$ to a receive end in the data communication system.

7. The encoding apparatus according to claim 6, wherein the logic circuit is further configured to generate the bit sequence $u_1^N$, wherein bit sequence $u_1^N$ comprises the K to-be-encoded information bits and N−K fixed bits, and the K to-be-encoded information bits are placed at the locations, in a zeroth layer in the encoding diagram, corresponding to the row location index set H.

8. The encoding apparatus according to claim 6, wherein the logic circuit is further configured to generate the bit sequence $D_1^N$, wherein the bit sequence $D_1^N$ comprises a bit that corresponds to a bit sequence $C_1^N$ and that is in the row location index set H in the encoding diagram and a fixed bit, and wherein the bit sequence $C_1^N$ is a bit sequence obtained after polar encoding is performed on $u_1^N$ based on the encoding diagram.

9. The encoding apparatus according to claim 8, wherein the layer location index set M comprises any one of a first layer to a $(\log_m^N - 1)^{th}$ layer.

10. The encoding apparatus according to claim 8, wherein the layer location index set M is determined based on the row location index set H.

11. An encoding apparatus comprising:
a memory; and
a processor coupled to the memory, wherein the processor is configured to generate a bit sequence $X_1^N$, wherein $X_1^N = D_1^N F_N$, $F_N$ is an N×N matrix, $F_N = F_2^{\otimes (\log_2(N))}$, $F_N$ is a Kronecker product of a plurality ($\log_2 N$) of matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of K to-be-encoded information bits in an encoding diagram that has a mother code length of N, and $u_1^N$ is an N bit sequence generated based on the K to-be-encoded information bits; wherein K is an integer greater than or equal to 1, N is an integral power of m, and m is a positive integer greater than 1; and wherein the locations of the K to-be-encoded information bits comprise a row location index set H indicating one or more rows in the encoding diagram to place the to-be-encoded information bits and a layer location index set M indicating one or more layers in the encoding diagram to place the to-be-encoded information bits, wherein 0≤H≤N, and 0<M≤$\log_m$ N−1, and wherein the layer location index set M is determined to decrease a bit error rate in encoding of the to-be-encoded information bits and a false alarm rate in decoding of the encoded information bits in a data communication system;
sending, by the processor, the bit sequence $X_1^N$ to a receive end in the data communication system.

12. The encoding apparatus according to claim 11, wherein the processor is further configured to generate the bit sequence $u_1^N$, wherein the bit sequence $u_1^N$ comprises the K to-be-encoded information bits and N−K fixed bits, and the K to-be-encoded information bits are placed at the locations, in a zeroth layer in the encoding diagram, corresponding to the row location index set H.

13. The encoding apparatus according to claim 11, wherein the processor is further configured to generate the bit sequence $D_1^N$, wherein the bit sequence $D_1^N$ comprises a bit that corresponds to a bit sequence $C_1^N$ and that is in the row location index set H in the encoding diagram and a fixed bit, and wherein the bit sequence $C_1^N$ is a bit sequence obtained after polar encoding is performed on $u_1^N$ based on the encoding diagram.

14. The encoding apparatus according to claim 13, wherein the layer location index set M comprises any one of a first layer to a $(\log_m N - 1)^{th}$ layer.

15. The encoding apparatus according to claim 13, wherein the layer location index set M is determined based on the row location index set H.

16. A non-transitory machine readable medium comprising instructions that cause a data processing system to perform operations comprising:
generating a bit sequence $X_1^N$, wherein $X_1^N = D_1^N F_N$, $F_N$ is an N×N matrix, $F_N = F_2^{\otimes (\log_2(N))}$, $F_N$ is a Kronecker product of a plurality ($\log_2 N$) of matrices $F_2$, and $$F = \begin{bmatrix} 1 & 0 \\ 1 & 1 \end{bmatrix};$$

N is a length of a mother code, $D_1^N$ is a bit sequence obtained after an input bit sequence $u_1^N$ is encoded based on locations of K to-be-encoded information bits in an encoding diagram that has a mother code length of N, and $u_1^N$ is an N bit sequence generated based on the K to-be-encoded information bits; wherein K is an integer greater than or equal to 1, N is an integral power of m, and m is a positive integer greater than 1; and wherein the locations of the K to-be-encoded information bits comprise a row location index set H indicating one or more rows in the encoding diagram to place the to-be-encoded information bits and a layer location index set M indicating one or more layers in the encoding diagram to place the to-be-encoded information bits, wherein 0≤H≤N, and 0<M≤$\log_m$ N−1, wherein the layer location index set M is determined to decrease a bit error rate in encoding of the to-be-encoded information bits and a false alarm rate in decoding of the encoded information bits in a data communication system;
sending, by the data processing system, the bit sequence $X_1^N$ to a receive end in the data communication system.

17. The non-transitory machine readable medium according to claim 16, wherein the operations further comprise generating the bit sequence $u_1^N$, wherein the bit sequence $u_1^N$ comprises the K to-be-encoded information bits and N−K fixed bits, and the K to-be-encoded information bits are placed at the locations, in a zeroth layer in the encoding diagram, corresponding to the row location index set H.

18. The non-transitory machine readable medium according to claim 16, wherein the further comprise generating the bit sequence $D_1^N$, $D_1^N$ comprises a bit that corresponds to a bit sequence $C_1^N$ and that is in the row location index set H in the encoding diagram and a fixed bit, and wherein the bit sequence $C_1^N$ is a bit sequence obtained after polar encoding is performed on $u_1^N$ based on the encoding diagram.

19. The non-transitory machine readable medium according to claim 18, wherein the layer location index set M comprises any one of a first layer to a $(\log_m N - 1)^{th}$ layer.

20. The non-transitory machine readable medium according to claim 18, wherein the layer location index set M is determined based on the row location index set H.

* * * * *

UNITED STATES PATENT AND TRADEMARK OFFICE
CERTIFICATE OF CORRECTION

PATENT NO.      : 11,362,677 B2
APPLICATION NO. : 16/926211
DATED           : June 14, 2022
INVENTOR(S)     : Xianbin Wang et al.

It is certified that error appears in the above-identified patent and that said Letters Patent is hereby corrected as shown below:

In the Claims

In Claim 1, Column 44, Line 10-11, "sending, by the processor, the bit sequence $X_1^N$ to a receive end in the data communication system." should be --sending, by the processor, the bit sequence.--.

In Claim 6, Column 44, Line 63-65, "an output interface circuit configured to output the bit sequence $X_1^N$ to a receive end in the data communication system." should be --an output interface circuit configured to output the bit sequence.--.

In Claim 11, Column 45, Line 49-52, "a false alarm rate in decoding of the encoded information bits in a data communication system; sending, by the processor, the bit sequence $X_1^N$ to a receive end in the data communication system." should be --a false alarm rate in decoding of the encoded information bits in a data communication system.--.

In Claim 16, Column 46, Line 38-41, "a false alarm rate in decoding of the encoded information bits in a data communication system; sending, by the data processing system, the bit sequence $X_1^N$ to a receive end in the data communication system." should be --a false alarm rate in decoding of the encoded information bits in a data communication system.--.

Signed and Sealed this
Eleventh Day of October, 2022

Katherine Kelly Vidal
*Director of the United States Patent and Trademark Office*